(12) United States Patent
Hunt et al.

(10) Patent No.: US 8,803,498 B2
(45) Date of Patent: Aug. 12, 2014

(54) SYSTEM, APPARATUS AND METHODS FOR CONTROLLING MULTIPLE OUTPUT CONVERTERS

(75) Inventors: Louis Roberts Hunt, Plano, TX (US); Dinesh Kumar Bhatia, Plano, TX (US); Poras T. Balsara, Plano, TX (US)

(73) Assignees: Cirasys, Inc., Dallas, TX (US); Board of Regents, The University of Texas System, Austin, TX (US)

( * ) Notice: Subject to any disclaimer, the term of this patent is extended or adjusted under 35 U.S.C. 154(b) by 242 days.

(21) Appl. No.: 13/373,673

(22) Filed: Nov. 22, 2011

(65) Prior Publication Data

US 2012/0139509 A1  Jun. 7, 2012

Related U.S. Application Data

(63) Continuation-in-part of application No. 12/487,242, filed on Jun. 18, 2009.

(60) Provisional application No. 61/458,850, filed on Dec. 2, 2010.

(51) Int. Cl.
*G05F 1/00* (2006.01)

(52) U.S. Cl.
USPC .......................... 323/283; 323/282; 323/285

(58) Field of Classification Search
USPC ................................................. 323/282–285
See application file for complete search history.

(56) References Cited

U.S. PATENT DOCUMENTS

| 5,138,250 | A | | 8/1992 | Capel |
| 5,379,210 | A | * | 1/1995 | Grujic et al. ............ 700/28 |
| 5,442,534 | A | | 8/1995 | Cuk et al. |
| 5,510,698 | A | * | 4/1996 | Stankovic et al. ............ 323/282 |
| 5,708,433 | A | | 1/1998 | Craven |
| 5,804,950 | A | | 9/1998 | Hwang et al. |
| 5,886,586 | A | | 3/1999 | Lai et al. |
| 5,943,224 | A | | 8/1999 | Mao |
| 6,084,450 | A | | 7/2000 | Smith et al. |
| 6,271,781 | B1 | * | 8/2001 | Pellon ............ 341/143 |
| 6,538,905 | B2 | | 3/2003 | Greenfield et al. |
| 6,545,887 | B2 | | 4/2003 | Smedley et al. |
| 6,674,272 | B2 | | 1/2004 | Hwang |
| 7,851,941 | B2 | | 12/2010 | Walley |

(Continued)

OTHER PUBLICATIONS

Hunt, L.R., et al., "Global transformations of nonlinear systems," IEEE Transactions on Automatic Control, 28 (1983), 24-31.

(Continued)

*Primary Examiner* — Jue Zhang
*Assistant Examiner* — Henry Lee, III
(74) *Attorney, Agent, or Firm* — Schultz & Associates, P.C.

(57) ABSTRACT

An apparatus and method is presented for implementing and controlling a voltage converter with one input voltage and multiple output voltages. In the case of boost and buck-boost converters, a converter circuit with one inductor and a switched group of parallel connection capacitors is realized, one parallel connection for each output voltage. A duty ratio is monitored for the inductor and the switched group of capacitors to provide a set of duty ratios. The duty ratios form a control vector which describes the control inputs. The output voltages are the control outputs describing a MIMO system. A generalized Cuk-Middlebrook modeling approach is applied to the voltage converter, along with linearization and MIMO control methods to regulate all output voltages to desired levels.

37 Claims, 5 Drawing Sheets

(56) References Cited

U.S. PATENT DOCUMENTS

| | | | |
|---|---|---|---|
| 8,014,879 B2* | 9/2011 | Latham et al. | 700/1 |
| 8,285,502 B2* | 10/2012 | Kenly et al. | 702/64 |
| 2001/0030879 A1* | 10/2001 | Greenfeld et al. | 363/17 |
| 2006/0158910 A1* | 7/2006 | Hunt et al. | 363/35 |
| 2010/0164282 A1 | 7/2010 | Tseng et al. | |

OTHER PUBLICATIONS

Sable, Dan M., et al., "Elimination of the positive zero in fixed frequency boost and flyback converters," Proceedings of $5^{th}$ IEEE Applied Power Electronics Conference, (1990), 205-211.

Taylor, Robert J., "Feedback Linearization of Fixed Frequency PWM Converters," Ph.D. Dissertation, University of Texas at Dallas, published. Nov. 2005.

R. Ridley, 11 ways to generate multiple outputs, Switching Power Magazine, 2005.

D. Ma and R. Bondale, Enabling power-efficient DVFS Operations in Silicon, IEEE Circuits and Systems Magazine, First Quarter, 2010, 14-30.

G. Meyer, L. R. Hunt, and R. Su, Nonlinear System Guidance in the Presence of Transmission Zero Dynamics, NASA Technical Memorandum 4661, Jan. 1995.

R. D. Middlebrook and S. Cuk, A general unified approach to modeling switching-converter power stages, IEEE Power Electronics Specialists Conference Record, Jun. 1976, 18-34.

Sable, Dan M., et al., "Elimination of the positive zero in fixed frequency boost and flyback converters," Proceedings of 5th IEEE Applied Power Electronics Conference, (1990).

Taylor, Robert J., "Feedback Linearization of Fixed Frequency PWM Converters," Ph.D. Dissertation, University of Texas at Dallas, published Nov. 2005.

* cited by examiner

SYSTEM, APPARATUS AND METHODS FOR CONTROLLING MULTIPLE OUTPUT CONVERTERS

CROSS-REFERENCE TO RELATED APPLICATIONS

This application claims priority to provisional application No. 61/458,850 filed on Dec. 2, 2010. This application is also a continuation-in-part of patent application Ser. No. 12/487,242 filed on Jun. 18, 2009.

FIELD OF THE INVENTION

This application relates to the development of an apparatus and methods for controlling multiple output voltages from a voltage converter, utilizing multiple input multiple output (MIMO) models based on a generalized Cuk-Middlebrook state-space averaging.

BACKGROUND

There is an ever increasing need for single voltage source, multiple output voltage converters. Hence, there are a variety of methods in the prior art that treat this as a single input, multiple output (SIMO) problem by decomposing the system into multiple single-input single-output (SISO) systems. These can involve various hardware configurations or can involve manipulating switching times in each switching period, but all of these essentially depend on applying standard single input, single output (SISO) control methods such as PID in some way.

Operational equilibrium points and corresponding duty ratios D, for a SISO system with common voltage converters are known. For example, the output voltage of a boost voltage converter is $1/(1-D)$ times the input voltage. The output voltage of a buck-boost voltage converter is $D/(1-D)$ times the input voltage.

There are several nonlinear control methods to deal directly with the nonlinear state equations for the SISO boost and buck-boost converters. If leading edge modulation is used to derive the output state equations, and if the zero dynamics are asymptotically stable, then input-output linearization techniques can be employed to stabilize the system and perform the desired output tracking while allowing the system to remain linear at all operating points.

As to prior art, Cuk et al. in U.S. Pat. No. 5,442,534 discloses an isolated, capacitive idling, Cuk switching mode converter with multiple output converters and PWM feedback control of duty cycle of switches in the converter. Cuk et al. discloses a converter with a primary side and multiple secondary sides separated by a transformer, the primary side controlled by one feedback loop and the secondary sides controlled by independent feedback loops. However, Cuk et al., does not disclose a single controller for the multiple output converters, instead relying on two or more separate and independent nonisolated feedback loops to independently control the duty cycle of each switch in the converter.

U.S. Pat. No. 7,851,941 to Walley discloses a method and system for multiple output capacitive buck-boost converter. Walley discloses a switch array controlled by a single state machine controller with integrated instructions for power control. The switch array is connected by two external switches to two output voltages having IN sensors which are connected to the state machine controller. However, Walley does not disclose a controller programmed for boost and buck-boost conversion utilizing leading edge modulation with attention to the zero dynamics or input-output linearization. Furthermore, Walley does not address stability of the multiple output capacitive buck-boost converter.

U.S. Patent Application No. 2010/0164282 to Tseng et al., discloses a single-input multi-output switching regulator converting an input voltage to a first output voltage at a first node and a second output voltage at a second node, the first output voltage and second output voltage being generated by two capacitive circuits integrated with an inductor and a set of switching elements. Tseng et al. further discloses a pair of settable switches providing a selectable set of interconnections between the two capacitive circuits and the input voltage, providing a selectable set of output voltages at the first and second nodes. Tseng et al. does not disclose any apparatus or methodology for controlling the duty cycles of the switching elements and does not address stability of the multiple output switching regulator.

In actuality, the single voltage source, multiple-output voltage converter has inherent coupling between the voltage outputs. What is needed is an application of a full multiple-input multiple-output theory to the design and control of voltage converters to properly account for this coupling.

BRIEF DESCRIPTION OF THE INVENTION

Modeling of a power circuit with multiple-output voltages shows that for the boost or buck-boost converters there is a natural coupling between duty ratios of control signals and the output voltages. This coupling, which is analogous to the coupling of translational and rotational dynamics in mechanical and aerospace systems, indicates that single input single output (SISO) models and control methods should be replaced with multiple input, multiple output (MIMO) models and control methods.

The invention provides a MIMO system for a power circuit. For a MIMO system, the Cuk-Middlebrook state-space averaging is generalized to model the control vector and regulate all output voltages to their desired levels.

In a first preferred embodiment, the power circuit is a voltage boost converter.

In a second preferred embodiment, the power circuit is a voltage buck-boost converter.

Combining the preferred embodiments with a control system, the invention provides for a voltage source connected to a voltage converter, to a modulator and to a controller. The voltage source provides power to operate a set of loads connected to the converter. The modulator controls the converter through a set of control signals to distribute the power from the voltage source, through a set of varied duty cycles. In the preferred embodiments, the voltage source is a battery providing driving current for the set of loads which require DC current at a differing set of voltage levels than the voltage source.

The MIMO state model and control methods of the invention find uses in, among other things, systems requiring electrical power where there is a single DC source at one voltage level and several loads that require power at different voltages.

BRIEF DESCRIPTION OF THE DRAWINGS

Aspects of the present disclosure are best understood from the following detailed description when read with the accompanying figures.

DETAILED DESCRIPTION

Figure 1:
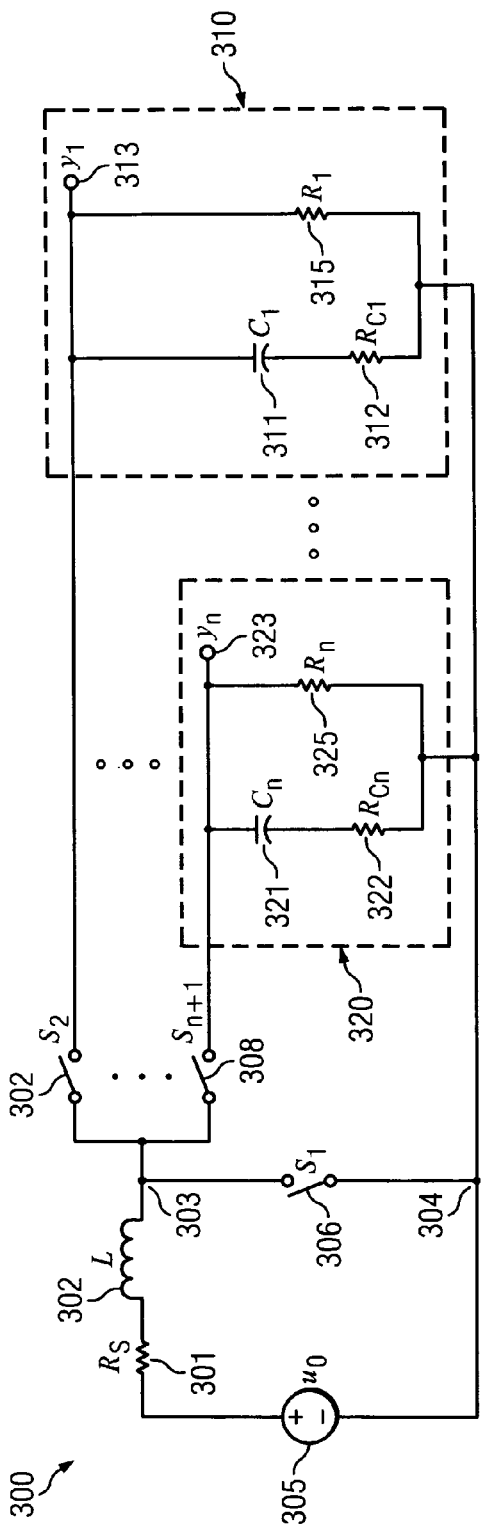
FIG. 1 is a circuit diagram of a preferred multiple output boost converter.

The disclosed embodiments provide novel concepts that can be applied in a wide variety of situations related to feedback control of non-linear systems. The embodiments disclosed are examples only and do not limit the scope of the claimed invention.

The disclosed embodiments illustrate a system and method for implementing and controlling a multiple-output converter. In particular, the embodiments employ a generalized Cuk-Middlebrook model to compute a duty ratio vector for a multiple output boost converter or a multiple output buck-boost converter. The apparatus and methods can also be applied to other converter types.

Many forms of control apparatus and methods are applicable to the present invention. Moreover, the parameters in the control apparatus are programmable, hence lending themselves to implementation in silicon, such as a general purpose CPU, a digital signal processor (DSP), a microcontroller, a controller, a mixed signal SoC, an ASIC, an FPGA or a conventional electrical circuit including discrete components. Proportional (P), Proportional-Integral (PI), and Proportional-Integral-Derivative (PID) controls are added for robustness.

It is an objective to control a device that has one input voltage but several output voltages. As an example, a converter circuit has one inductor and a parallel connection of capacitors, one capacitor for each output voltage. A switch is included to control the state of the inductor and a switch included for each capacitor to control the state of capacitive charging. Switching constraints are applied to the voltage converter. As an important example of one switching constraint, one switch is closed and all others open at any given time: for all possible switch combinations. In a switching period, each switch is driven according to a duty ratio where all of the duty ratios for all switches add up to one. These duty ratios are the control vector d which define the set of control signals and the output voltages.

Hence, the preferred embodiments describe a multiple input, multiple output (MIMO) control system. Cuk-Middlebrook state-space averaging is generalized to model the control vector d and to apply MIMO control methods to regulate all output voltages to a set of desired levels.

The boost and buck-boost converters are of particular interest. For a boost or buck-boost converter embodiment a circuit is described having a single inductor with one switch and a parallel connection of n≥2 capacitors, each having an associated switch. One switch is assumed to be closed while all others are open at any given time. For the inductor with current state $x_1$ switch $S_1$ opens and closes having a duty ratio $d_1$. For i=1, 2, ..., n each capacitor $C_i$ has an associated voltage state $x_{i+1}$, switch $S_{i+1}$ and duty ratio $d_{i+1}$ describing the opening and closing of switch $S_{i+1}$. Using Kirchhoff's laws, each linear circuit is analyzed when exactly one switch is closed. State-space averaging is performed over the n+1 duty ratios (as described by the control vector d) in a generalized Cuk-Middlebrook model. The n+1 duty ratios sum to one in each switching period. One duty ratio, say $d_1$, is eliminated by symmetry. Then, n outputs $y_i$, i=1, 2, ..., n (the set of output voltages) are associated with the voltages across the capacitors $C_i$, i=1, 2, ..., n, respectively. With n duty ratios defining control vector d as the set of control signals and n outputs as the set of output voltages, a square (same number of controls as outputs) MIMO control problem is realized.

FIG. 1 illustrates a preferred embodiment for a boost converter having n output voltages. Boost converter 300 comprises series resistor ($R_s$) 301 connected in series with inductor (L) 302, switch ($S_1$) 306 and DC voltage input ($u_0$) 305. A set of capacitive circuits are connected in parallel between node 303 and node 304. Parallel capacitive circuit 310 comprises switch ($S_2$) 307 connected between node 303 and node 313 which is further connected in series with capacitor ($C_1$) 311, DC series resistance ($R_{C1}$) 312 associated with the capacitor $C_1$, and node 304. Load resistor ($R_1$) 315 is connected between node 313 and node 304.

There are (n−1) additional parallel capacitive circuits similar to parallel capacitive circuit 310 connected between node 303 and node 304. For example, parallel capacitive circuit 320 comprises switch ($S_{n+1}$) 308 connected between node 303 and node 323 which is further connected in series with capacitor ($C_n$) 321, DC series resistance ($R_{Cn}$) 322 associated with the capacitor $C_n$, and node 304. Load resistor ($R_n$) 325 is connected between node 323 and node 304.

Figure 2:
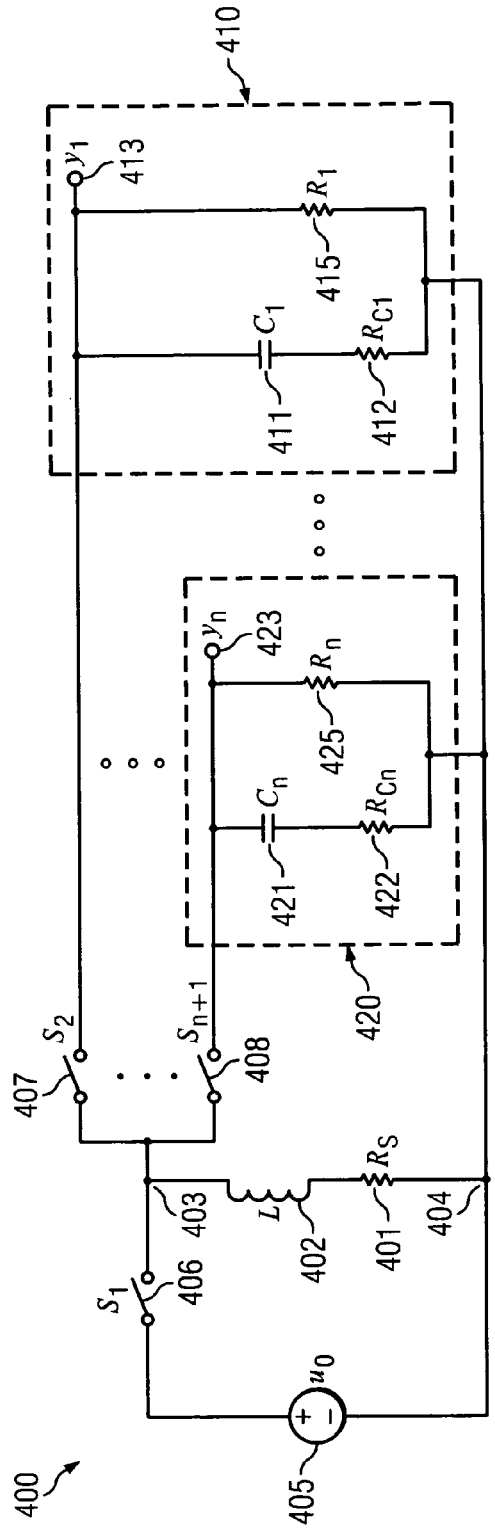
FIG. 2 is a circuit diagram of a preferred multiple output buck-boost converter.

FIG. 2 illustrates a preferred embodiment for a buck-boost converter having n output voltages. Buck-boost converter 400 comprises a switch ($S_1$) 406 connected in series with an inductor (L) 402 which is further connected to series resister (Rs) 401 and a DC voltage input ($u_0$) 405. Two parallel capacitive circuits are connected between node 403 and node 404. Parallel capacitive circuit 410 comprises switch ($S_2$) 407 connected between node 403 and node 413 which is further connected in series with capacitor ($C_1$) 411, DC series resistance ($R_{C1}$) 412 associated with capacitor $C_1$, and node 404. Load resistor ($R_1$) 415 is connected between node 413 and node 404.

There are (n−1) additional parallel capacitive circuits similar to parallel capacitive circuit 410 connected between node 403 and node 404. For example, parallel capacitive circuit 420 comprises switch ($S_{n+1}$) 408 connected between node 403 and node 420 which is further connected in series with capacitor ($C_n$) 421, DC series resistance ($R_{Cn}$) 422 associated with capacitor $C_n$, and node 404. Load resistor ($R_n$) 425 is connected between node 423 and node 404.

In general, for both the boost and buck-boost converters: $R_i$ is the load associated with the capacitor $C_i$ for i=1, 2, ..., n, $R_s$ is the DC series resistance of the inductor L, $R_{Ci}$ is the equivalent series resistance of the capacitor $C_i$ for i=1, 2, ..., n and $u_0$ is the input voltage. The system is characterized by the state vector $$x = \begin{bmatrix} x_1 \\ x_2 \\ x_3 \\ \ldots \\ x_{n+1} \end{bmatrix}, \quad \text{(eq. 1)}$$

the set of output voltages in output voltage vector $$y = \begin{bmatrix} y_1 \\ y_2 \\ \ldots \\ y_n \end{bmatrix}. \quad \text{(eq. 2)}$$

A set of control signals are applied to the n+1 switches $S_1, S_2, \ldots, S_{n+1}$ according to a symmetrized n-tuple control vector $$d = \begin{bmatrix} d_2 \\ d_3 \\ \ldots \\ d_{n+1} \end{bmatrix}. \quad \text{(eq. 3)}$$

where $d_1 = 1 - d_2 - d_3 - \ldots - d_{n+1}$ and the control vector values are the duty ratios of the set of control signals. In the exemplary embodiments, the output voltages $y_1, y_2, \ldots y_n$ are associated to the state vector values $x_1, x_2, \ldots x_{n+1}$: $y_1$ is associated to $x_2$, $y_2$ is associated to $x_3$, $y_n$ is associated to $y_{n+1}$, and so forth.

Figure 3:
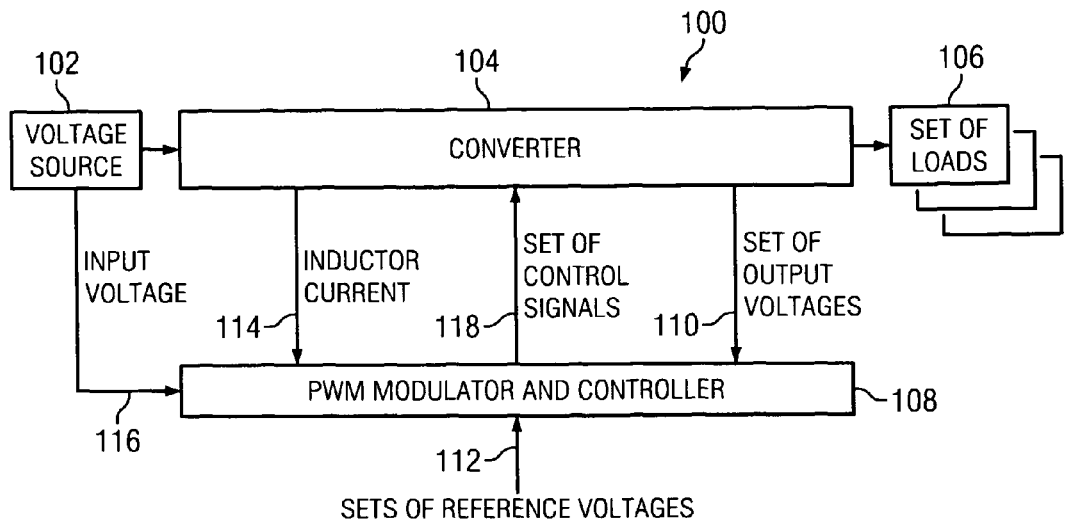
FIG. 3 is a block diagram of a multiple input multiple output (MIMO) voltage converter system according to a preferred embodiment.
Figure 4:
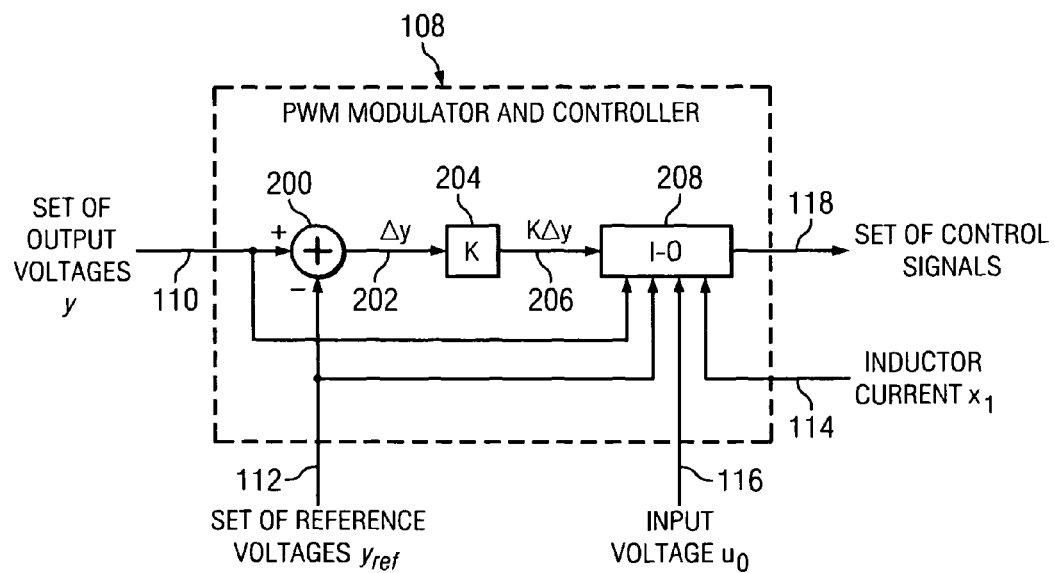
FIG. 4 is a block diagram of a preferred embodiment of a pulse width modulation (PWM) controller having multiple inputs and multiple control signals generated from the inputs.

The control apparatus of FIGS. 3 and 4 is an exemplary control embodiment suitable for controlling the voltage converters of FIGS. 1 and 2 and is amenable to input-output linearization methods that do not constrain stability to one operating point, but rather to a set of operating points spanning the expected range of operation during startup and transient modes of operation. Boost and buck-boost converters operating in the continuous conduction mode with trailing edge modulation give rise to unstable zero dynamics where the linear segment of the system about an operating point has a right half plane zero. In an additional control embodiment, leading-edge modulation is implemented that changes the zero dynamics, so that the linear part of the system has only left half plane zeros. Since the resulting nonlinear system possesses stable zero dynamics, input-output feedback linearization can be employed wherein a linearizing transformation is performed and used to define control signal inputs to a converter. This transformation is local in nature, but it can be applied in a neighborhood of any state space operating point for multiple DC-DC conversions.

Referring to FIG. 3, the voltage converter and control system includes primary power source 102 electrically connected to converter 104. Converter 104 provides power to a set of loads 106 via a set of output voltages 110 characterized by output voltage vector, y. Converter 104 is a converter preferably selected from one of the multiple output boost converter of FIG. 1 and the multiple output buck-boost converter of FIG. 2. In alternate embodiments, other types of multiple output voltage converters are used for converter 104.

Converter 104 is further connected to PWM modulator/controller 108. PWM modulator/controller 108 receives set of output voltages 110 from converter 104, set of reference voltages 112 characterized by a second voltage vector, $y_{ref}$, from a set of voltage reference sources (not shown), inductor current 114 (characterized by state vector value $x_1$) measured from series inductor L within converter 104 and primary voltage 116 (characterized by $u_0$) from primary power source 102. The set of voltage reference sources are preferably integrated into PWM modulator/controller 108.

PWM modulator/controller 108 uses set of output voltages 110, set of reference voltages 112, inductor current 114 and primary voltage 116 to generate set of control signals 118, characterized by a control vector d and used to control converter 104. The details of how PWM modulator/controller 108 generates set of control signals 118 will be described in more detail below.

Referring to FIG. 4, PWM modulator/controller 108 includes summing circuit 200, gain circuit 204 modulating circuit 208. FIG. 4 shows a first connection to receive set of output voltages 110, a second connection to receive set of reference voltages 112, a third connection to receive inductor current 114, a fourth connection to receive primary voltage 116, and a fifth connection to set of control signals 118. Summing circuit 200 is connected to the first connection and the second connection to create a set of difference voltages, $\Delta y = (y - y_{ref})$, characterized by third voltage vector 202. Gain circuit 204, is connected to summing circuit 200, and provides adjustment to third voltage vector 202 to arrive at fourth voltage vector 206. The gain circuit employs a gain matrix (K) multiplied by third voltage vector 202, $v = K\Delta y$. Modulating circuit 208 is connected to gain circuit 204, the second connection, the third connection, the fourth connection and the fifth connection. Modulation circuit 208 creates set of control signals 118 based on set of output voltages 110, set of reference voltages 112, fourth voltage vector 206, inductor current 114 and primary voltage 116. Set of control signals 118 is characterized by a control vector d.

The boost and buck-boost converters of FIGS. 1 and 2 with the control system of FIGS. 3 and 4, are further characterized by the set of reference voltages $$y_{ref} = \begin{bmatrix} y_{10} \\ y_{20} \\ \ldots \\ y_{n0} \end{bmatrix}, \quad \text{(eq. 4)}$$

the set of difference (error) voltages $$\Delta y = \begin{bmatrix} y_1 - y_{10} \\ y_2 - y_{20} \\ \vdots \\ y_n - y_{n0} \end{bmatrix}, \quad \text{(eq. 5)}$$

and the gain matrix $$K = \begin{bmatrix} k_{11} & k_{12} & \ldots & k_{1n} \\ k_{21} & k_{22} & \ldots & k_{2n} \\ \vdots & \vdots & \vdots & \vdots \\ k_{n1} & k_{n2} & \ldots & k_{nn} \end{bmatrix}. \quad \text{(eq. 6)}$$

For MIMO systems, gain matrix K can include off-diagonal elements that define coupling between the set of difference voltages (errors). Moreover, the gain matrix K preferably includes proportional (P), integral (I) and derivative (D) gain components for diagonal and off-diagonal elements. The gain matrix K does not require adjustment for each operating point, i.e., no gain scheduling is required. In another exemplary embodiment, the reference input for each output is incrementally adjustable to insure convergence at an operating point.

In a first exemplary embodiment, modulation circuit 208 includes an electrical circuit that provides the set of control signals to a boost converter such that a set of duty ratios corresponding to the set of control signals is generated according to a generalized Cuk-Middlebrook model for the boost converter and according to the linearization methods described further below.

In a second exemplary embodiment, modulation circuit 208 includes an electrical circuit that provides set of control signals 118 to a buck-boost converter such that a set of duty ratios of the set of control signals are generated according to a generalized Cuk-Middlebrook model result for the buck-boost converter and according to the linearization methods described further below.

PWM modulator/controller 108 is implemented according to one of a group of: a discrete electronics circuit; a set of programmed instructions embodied in an FPGA; a set of programmed instructions embodied in a digital signal processor; a set of programmed instructions embodied in an ASIC; and combinations thereof. A suitable hardware platform includes clocking circuits, a CPU (if required), a non-volatile memory for storing the programmed instructions, and a volatile memory for storing intermediate results and for storing calculated parameters for the set of control signals.

For example, in one embodiment, a digital signal processor and a computer program stored on a computer readable medium is provided for programming the digital signal processor to control the PWM modulated/controller. The digital signal processor in operation performs the function of summing circuit 200, gain circuit 204, modulating circuit 208 and is electrically connected to inputs and outputs of those components appropriately via analog-to-digital converters and logic converters.

Figure 7:
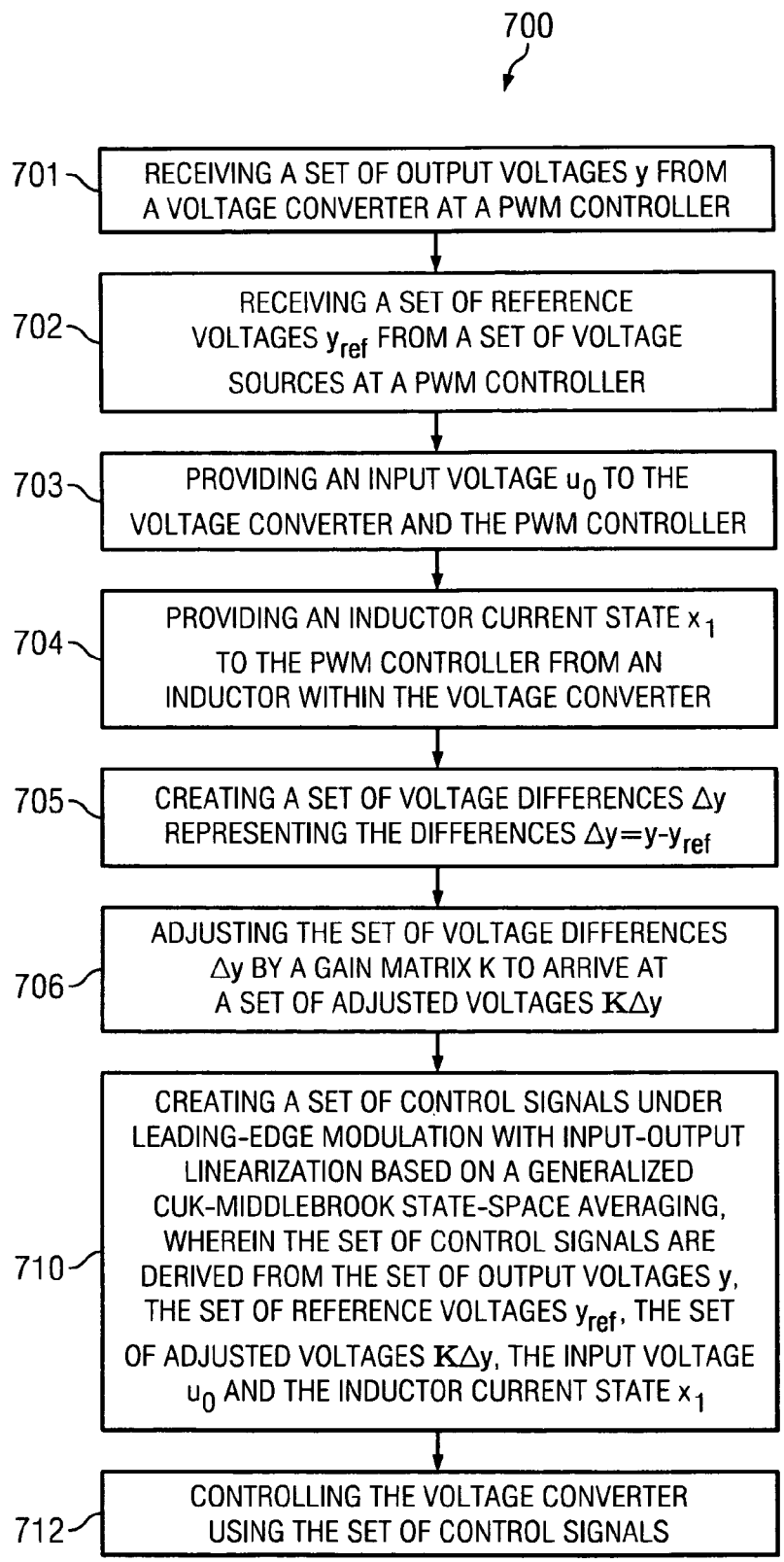
FIG. 7 is a flowchart depicting the method of implementing a control function for a voltage converter according to the preferred embodiments.

Referring to FIG. 7, control method 700 for a multiple input multiple output (MIMO) voltage converter is described. Control method 700 is suitable to control the boost converter of FIG. 1 and the buck-boost converter of FIG. 2 using the apparatus of FIGS. 3 and 4. At step 701, the MIMO voltage converter is controlled by receiving a set of output voltages y from a PWM controller. At step 702, a set of reference voltages $y_{ref}$ from a reference voltage source. At step 703, an input voltage $u_0$ is received from a power source at the MIMO voltage converter and the PWM controller. At step 704, an inductor current state x is received at the PWM controller from an inductor in the MIMO voltage converter. At step 705, set of voltage differences Δy are created from the set of output voltages and the set of reference voltages as, at step 706, the set of voltage differences Δy are adjusted by a gain to arrive at a set of adjusted voltages KΔy according to the gain matrix K.

At step 710, a control vector d comprising a set of duty ratios is created from the set of output voltages y, the set of reference voltages $y_{ref}$, the set of adjusted voltages KΔy, the input voltage $u_0$, and the inductor current state $x_1$. At step 710, the control vector d preferably provides leading-edge modulation with input-output linearization based on a generalized Cuk-Middlebrook state-space averaging. The control vector d is also created using a first order system, stabilizing gain, created from a variety of choices and a desired output voltage for y.

In step 712, the MIMO voltage converter is controlled using the set of control signals d.

In addition to input-output linearization, other control methods could be employed. To evaluate the specific requirements for the control system and method, a linearization, such as a Taylor series linearization, is performed about the corresponding equilibrium state for the set of desired output voltages. The linearization is preferably performed under leading edge modulation, but can also be performed under trailing edge modulation. Linear state feedback is applied to place the n eigenvalues of the appropriate state matrix in the open left half plane (See for example, C. T. Chen, *Linear System Theory and Design*, 3$^{rd}$ ed., Oxford, 1999) The linear state feedback stabilizes the system at the equilibrium state and establishes the output voltage vector y to the desired set of values. Adaptive control methods for MIMO control systems (See for example, S. Sastry and M Bodson, *Adaptive Control: Stability, Convergence, and Robustness*, Prentice-Hall, 1994) are used to handle parameter changes and load changes. However, a different set of desired output voltages or different set of load resistances/impedances requires a different linearization and a different control design. The control method just mentioned is just one of a variety of linear and nonlinear design techniques for MIMO systems that are available. For example, with the Taylor series linearization, MIMO transfer function matrices can be determined and MIMO compensators constructed (see C. T Chen, 1999). This allows for an analog implementation if desired.

The preferred linearization technique is the nonlinear method called input-output linearization (See for example, A. Isidori, *Nonlinear Control Systems*, 3$^{rd}$ ed., Springer-Verlag, London, 1995) in combination with Cuk-Middlebrook state averaging, which allows for the handling of changes in desired output voltages and loads using the same basic model and design at every point. The modulation circuit of the PWM controller is configured to implement the resulting formula.

The Cuk-Middlebrook state averaging process proceeds as follows. With switch $S_1$ closed and switches $S_2, S_3, \ldots, S_{n+1}$ open, a linear system results:

$$\dot{x} = A_1 x + B_1 u_0$$

$$y = G_1 x \quad \text{(eqs.7)}$$

for state vector x, output voltage vector y, matrices $A_1, B_1$, and $G_1$ and where the dot denotes a time derivative.

Similarly with switch $S_2$ closed and switches $S_1, S_3, \ldots, S_{n+1}$ open the linear system results:

$$\dot{x} = A_2 x + B_2 u_0$$

$$y = G_2 x \quad \text{(eqs.8)}$$

for appropriate matrices $A_2, B_2$, and $G_2$.

With switch $S_3$ closed and switches $S_1, S_2, \ldots, S_{n+1}$ open the linear system results:

$$\dot{x} = A_3 x + B_3 u_0$$

$$y = G_3 x \quad \text{(eqs.9)}$$

for appropriate matrices $A_3, B_3$, and $G_3$.

Similar equations result for each closed switch. With switch $S_{n+1}$ closed and switches $S_1, S_2, \ldots, S_n$ open the linear system results:

$$\dot{x} = A_{n+1}x + B_{n+1}u_0$$

$$y = G_{n+1}x \qquad \text{(eqs.10)}$$

for appropriate matrices $A_{n+1}$, $B_{n+1}$, and $G_{n+1}$.

Defining:

$$A = A_1(1-d_2-d_3) + A_2(d_2) + A_3(d_3) + \ldots + A_{n+1}(d_{n+1}),$$

$$B = B_1(1-d_2-d_3) + B_2(d_2) + B_3(d_3) + \ldots + B_{n+1}(d_{n+1}),$$

$$G = G_1(1-d_2-d_3) + G_2(d_2) + G_3(d_3) + \ldots + G_{n+1}(d_3), \qquad \text{(eqs.11)}$$

the system is state-space averaged by taking $$\dot{x} = Ax + Bu_0$$

$$y = Gx \qquad \text{(eqs.12)}$$

and converting eqs. 12 into the standard control form:

$$\dot{x} = A'x + B'd$$

$$y = Cx + Dd \qquad \text{(eqs.13)}$$

with new A', B' matrices, a C matrix and a D matrix.

Given desired output voltages $y_{i0}$ for $y_i$, $i=1, 2, \ldots, n$ the equations $$\dot{x}_1 = 0 \text{ for } i=1,2,\ldots,n+1;$$

$$y_i = y_{i0} \text{ for } i=1,2,\ldots,n \qquad \text{(eqs.14)}$$

are solved to find the corresponding solutions $x_{i0}$, for $i=1, 2, \ldots, n+1$ and the matrix elements $D_i$, for $i=1, 2, \ldots, n$. Asymptotically stabilizing the system to the state $$x = \begin{bmatrix} x_{10} \\ x_{20} \\ x_{30} \\ \ldots \\ x_{(n+1)0} \end{bmatrix}, \qquad \text{(eq. 15)}$$

establishes the desired steady state output voltage vector $$Y_0 = \begin{bmatrix} y_{10} \\ y_{20} \\ \ldots \\ y_{n0} \end{bmatrix}. \qquad \text{(eq. 16)}$$

In practice, the set of reference voltages $y_{ref}$ in the PWM converter of FIG. 4 corresponds to the desired steady state output voltage vector $Y_0$.

Multiple Output Boost Converter

Beginning with the general boost converter case for n output voltages, application of the generalized Cuk-Middlebrook model with leading edge modulation ($y_i$ is sampled just before $S_{i+1}$ shuts off) results in dynamic state equations for the boost converter of FIG. 1 as follows:

$$\dot{x}_1 = \frac{u_0}{L} - \frac{R_s x_1}{L} - \frac{1}{L}\left[\frac{R_1}{(R_1+R_{C1})}(R_{C1}x_1+x_2)\right]d_2 - \qquad \text{(eqs. 17)}$$

-continued $$\frac{1}{L}\left[\frac{R_1}{(R_1+R_{C2})}(R_{C2}x_1+x_3)\right]d_3 - \ldots -$$

$$\frac{1}{L}\left[\frac{R_1}{(R_1+R_{Cn})}(R_{Cn}x_1+x_{n+1})\right]d_{n+1}$$

$$\dot{x}_2 = -\frac{1}{C_1(R_1+R_{C1})}x_2 + \frac{R_1}{C_1(R_1+R_{C1})}x_1 d_2$$

$$\vdots$$

$$\dot{x}_{n+1} = -\frac{1}{C_n(R_n+R_{Cn})}x_{n+1} + \frac{R_n}{C_n(R_n+R_{Cn})}x_1 d_{n+1}$$

$$y_1 = \frac{R_1}{(R_1+R_{C1})}(R_{C1}x_1+x_2)$$

$$\vdots$$

$$y_n = \frac{R_n}{(R_n+R_{Cn})}(R_{Cn}x_1+x_{n+1})$$

In steady state equilibrium, useful approximations for the buck-boost converter are $$x_{10} = \frac{1}{u_0}\left(\frac{x_{20}^2}{R_1} + \ldots + \frac{x_{(n+1)0}^2}{R_n}\right) \qquad \text{(eqs. 18)}$$

$$x_{10} = \frac{x_{i0}}{R_{i-1}D_i}, \quad i = 2, \ldots, n+1$$

The output state variables $y_i$ are associated directly to the states $x_{i+1}$. Referring again to FIG. 1, the output voltage $y_1$ at node 313 is approximately the voltage $x_2$ across capacitor $C_2$; the output voltage $y_n$ at node 323 is approximately the voltage $x_{n+1}$ across capacitor $C_{n+1}$, and the current through inductor 302 is $x_1$. To simplify notation, select $y_i$, $i=1, 2, \ldots, n$ and $x_1$ as our new coordinates instead of $x_1$, $x_2$, and $x_{n+1}$. The equilibrium state of the boost converter is now $(y_{10}, \ldots, y_{n0}, x_{10})$, and the new state equations are:

$$\dot{y}_1 = \alpha_1 + \beta_{11}d_2 + \beta_{12}d_3 + \ldots + \beta_{1n}d_{n+1} \qquad \text{(eqs. 19)}$$

$$\vdots$$

$$\dot{y}_n = \alpha_n + \beta_{n1}d_2 + \beta_{n2}d_3 + \ldots + \beta_{nn}d_{n+1}$$

$$\dot{x}_1 = \frac{u_0}{L} - R_s\frac{x_1}{L} - \frac{y_1}{L}d_2 - \frac{y_2}{L}d_3 - \ldots - \frac{y_n}{L}d_{n+1}.$$

In Eqs. 19, $\alpha_i$, $i=1, \ldots, n$ and $\beta_{i,j}$, $i,j=1, \ldots, n$ are easily computed functions of $y_1$, $x_1$, $R_i$, $u_0$, $L$, $C_i$, $R_{C_i}$, $R_s$ for $i=1, \ldots, n$ according to:

$$\alpha_i = \frac{R_i}{R_i+R_{C_i}}\left[R_{C_i}\frac{u_0}{L} + \left(-\frac{R_{C_i}R_s}{L} + \frac{R_{C_i}}{C_i(R_i+R_{C_i})}\right)x_1\right] - \qquad \text{(eqs. 20)}$$

$$\frac{1}{R_i+R_{C_i}}\frac{y_i}{C_i},$$

$$\beta_{ii} = \frac{R_i}{R_i+R_{C_i}}\left(-\frac{R_{C_i}y_i}{L} + \frac{R_i x_1}{C_i(R_i+R_{C_i})}\right),$$

$$\beta_{ij} = -\frac{R_i R_{C_i}}{R_i+R_{C_i}}\frac{y_j}{L},$$

for $i, j = 1, \ldots, n, i \neq j$.

To build the boost converter circuit, L, $C_i$, and $R_{C_i}$ are chosen to satisfy:

$$R_{C_1}C_1R_1D_2 + R_{C_2}C_2R_2D_3 + \ldots + R_{C_n}C_nR_nD_{n+1} - L > 0 \qquad \text{(eq.21)}$$

The condition of eq. 21 makes the zero dynamics asymptotically stable, enabling input-output linearization methods and is a generalization of the Ridley condition for a single capacitor boost converter (see R. Ridley, *Eleven Ways to Generate Multiple Outputs*, Switching Power Magazine, 2005). The input voltage $u_0$ and the loads $R_i$, $i=1, \ldots, n$ can change for the device as long as the condition of eq. 21 is not violated.

The output state vector y and set of difference voltages are controlled according to:

$$\dot{y}_i = k_{i1}(y_1 - y_{10}) - k_{i2}(y_2 - y_{20}) - \ldots - k_{in}(y_n - y_{n0})$$
$$\text{for } i=1,\ldots,n \quad \text{(eq.22)}$$

where the n×n gain matrix $K=[k_{ij}]$ has all eigenvalues in the open right half plane and $(y_{10}, \ldots, y_{n0}, x_{10})$ is the equilibrium state for the system. The first n state equations, which are linear in the duty ratios $d_i$, $i=2, \ldots, n+1$, are then solved to asymptotically stabilize the system about the equilibrium state as desired.

Combining eqs.19 and eq.22, the first n state equations are $$\beta_{11}d_2 + \beta_{12}d_3 + \ldots + \beta_{1n}d_{n+1} = \quad \text{(eqs. 23)}$$
$$-k_{11}(y_1 - y_{10}) - k_{12}(y_2 - y_{20}) - \ldots - k_{1n}(y_n - y_{n0}) - \alpha_1.$$
$$\vdots$$
$$\beta_{n1}d_2 + \beta_{n2}d_3 + \ldots + \beta_{nn}d_{n+1} =$$
$$-k_{n1}(y_1 - y_{10}) - k_{n2}(y_2 - y_{20}) - \ldots - k_{nn}(y_n - y_{n0}) - \alpha_n.$$

The solution to eqs.23 is simply the column vector in the right hand side multiplied on the left by the inverse of the (n×n) $\beta=[\beta_{ij}]$ matrix, $\beta^{-1}$. The general solutions are given according to:

$$d = -\beta^{-1}[K(y - Y_0) - \alpha] \quad \text{(eq. 24)}$$

where $$\alpha = \begin{bmatrix} \alpha_1 \\ \vdots \\ \alpha_n \end{bmatrix}. \quad \text{(eq. 25)}$$

Coupling occurs since each duty ratio is a function of all output state variables $y_1, y_2, \ldots, y_n$.

For the case n=2, the solutions to eq.24 are $$d_2 = \frac{\beta_{22}(-k_{11}(y_1 - y_{10}) - k_{12}(y_2 - y_{20}) - \alpha_1) - \beta_{12}(-k_{21}(y_1 - y_{10}) - k_{22}(y_2 - y_{20}) - \alpha_2)}{\beta_{11}\beta_{22} - \beta_{12}\beta_{21}} \quad \text{(eqs. 26)}$$

$$d_3 = -\frac{\beta_{21}(-k_{11}(y_1 - y_{10}) - k_{12}(y_2 - y_{20}) - \alpha_1) - \beta_{11}(-k_{21}(y_1 - y_{10}) - k_{22}(y_2 - y_{20}) - \alpha_2)}{\beta_{11}\beta_{22} - \beta_{12}\beta_{21}}$$

with the denominator $(\beta_{11}\beta_{22} - \beta_{12}\beta_{21})$ evaluated as:

$$\frac{R_1 R_2 x_1}{(R_1 + R_{C_1})(R_2 + R_{C_2})} \begin{bmatrix} -\frac{R_2 R_{C_1} y_1}{LC_2(R_2 + R_{C_2})} - \frac{R_1 R_{C_2} y_2}{LC_1(R_1 + R_{C_1})} + \\ \frac{R_1 R_2 x_1}{C_1 C_2 (R_1 + R_{C_1})(R_2 + R_{C_2})} \end{bmatrix} \quad \text{(eq. 27)}$$

Coupling occurs since each duty ratio is a function of both output state variables $y_1$ and $y_2$.

The generalized Ridley condition for the boost converter and continuous conduction mode assumptions guarantee that this denominator is nonzero. The inverse matrix $\beta^{-1}$ for the n-stage boost converter is derived in the appendix.

Multiple Output Buck-Boost Converter

Turning to the buck-boost converter, refer to FIG. 2. Using leading edge modulation ($y_1$ is sampled just before $S_{i+1}$ shuts off) the dynamic state equations for n capacitors after Cuk-Middlebrook like modeling are $$\dot{x}_1 = \frac{u_0}{L} - R_s \frac{x_1}{L} - \frac{1}{L}\left[\frac{R_1}{(R_1 + R_{C_1})}(R_{C_1} x_1 + x_2) + u_0\right]d_2 - \quad \text{(eqs. 28)}$$
$$\frac{1}{L}\left[\frac{R_2}{(R_2 + R_{C_2})}(R_{C_2} x_1 + x_3) + u_0\right]d_3 - \ldots -$$
$$\frac{1}{L}\left[\frac{R_n}{(R_n + R_{C_n})}(R_{C_n} x_1 + x_{n+1}) + u_0\right]d_{n+1}$$

$$\dot{x}_2 = -\frac{1}{C_1(R_1 + R_{C_1})} x_2 + \frac{R_1}{C_1(R_1 + R_{C_1})} x_1 d_2$$
$$\vdots$$
$$\dot{x}_{n+1} = -\frac{1}{C_n(R_n + R_{C_n})} x_{n+1} + \frac{R_n}{C_n(R_n + R_{C_n})} x_1 d_{n+1}$$

$$y_1 = -\frac{R_1}{R_1 + R_{C_1}}[R_{C_1} x_1 + x_2]$$
$$\vdots$$
$$y_n = -\frac{R_n}{R_n + R_{C_n}}[R_{C_n} x_1 + x_{n+1}]$$

In steady state equilibrium, useful approximations for the buck-boost converter are $$x_{10} = \frac{1}{u_0}\left(\frac{x_{20}(u_0 + x_{20})}{R_1} + \ldots + \frac{x_{(n+1)0}(u_0 + x_{(n+1)0})}{R_n}\right) \quad \text{(eqs. 29)}$$
$$x_{10} = \frac{x_{i0}}{R_{i-1} D_i}, i = 2, \ldots, n+1$$

The output state variables $y_i$ are associated directly to the states $x_{i+1}$. Referring again to FIG. 2, the output voltage $y_1$ at node 413 is approximately the voltage $x_2$ across capacitor $C_2$; the output voltage $y_2$ at node 423 is approximately the voltage $x_3$ across capacitor $C_3$ and the current through the inductor 402 is $x_2$. To simplify notation, select $y_i$, $i=1, 2, \ldots, n$ and $x_1$ as new coordinates instead of $x_1$, $x_2$, and $x_{n+1}$. The equilibrium state of the buck-boost converter is now $(y_{10}, \ldots, y_{n0}, x_{10})$, and the new state equations are $$\dot{y}_1 = \alpha_1 + \beta_{11}d_2 + \beta_{12}d_3 + \ldots + \beta_{1n}d_{n+1} \quad \text{(eqs. 30)}$$
$$\vdots$$
$$\dot{y}_n = \alpha_n + \beta_{n1}d_2 + \beta_{n2}d_3 + \ldots + \beta_{nn}d_{n+1}$$
$$\dot{x}_1 = \frac{u_0}{L} - R_s \frac{x_1}{L} + \frac{(y_1 - u_0)}{L}d_2 +$$
$$\frac{(y_2 - u_0)}{L}d_3 + \ldots + \frac{(y_n - u_0)}{L}d_{n+1}$$

The $\alpha_i$, $i=1, \ldots, n$ and $\beta_{ij}$, $i,j=1, \ldots, n$ are easily computed functions of $y_i$, $x_1$, $R_i$, $u_0$, $L$, $C_i$, $R_{C_i}$, $R_s$ according to:

$$\alpha_i = -\frac{R_i}{R_i + R_{C_i}}\left[R_{C_i}\frac{u_0}{L} + \left(-\frac{R_{C_i}R_s}{L} + \frac{R_{C_i}}{C_i(R_i + R_{C_i})}\right)x_1\right] - \quad \text{(eqs. 31)}$$

$$\frac{1}{R_i + R_{C_i}}\frac{y_i}{C_i},$$

$$\beta_{ii} = -\frac{R_i}{R_i + R_{C_i}}\left(\frac{R_{C_i}(y_i - u_0)}{L} + \frac{R_i x_1}{C_i(R_i + R_{C_i})}\right),$$

$$\beta_{ij} = -\frac{R_i R_{C_i}}{R_i + R_{C_i}}\frac{(y_j - u_0)}{L},$$

for $i, j = 1, \ldots, n, i \neq j$

Note that the $\alpha$'s and $\beta$'s for the buck-boost converter are different from those of the boost converter.

To build the buck-boost circuit, L, $C_i$ and $R_{C_i}$ are chosen to satisfy:

$$(R_{C_1}C_1R_1D_2 + R_{C_2}C_2R_2D_3 + \ldots + R_{C_n}C_nR_nD_{n+1} - L)$$
$$x_{10} > -(R_{C_1}C_1R_{C_2}C_2 + \ldots + R_{C_n}C_n)u_0 \quad \text{(eq.32)}$$

The condition of eq.32 makes the zero dynamics asymptotically stable, enabling input-output linearization methods and is a generalization of the Ridley condition for a single capacitor buck-boost converter. The input voltage $u_0$ and the loads $R_i$, i=1, ..., n can change for the buck-boost circuit as long as the condition of eq.32 is not violated.

The output state vector y and set of difference voltages are controlled according to:

$$\dot{y}_i - k_{i1}(y_1 - y_2) - k_{i2}(y_2 - y_{20}) - \ldots - k_{in}(y_n - y_{n0})$$
for $i = 1, \ldots, n$ \quad (eq.33)

where the n×n gain matrix $K = [k_{ij}]$ has all eigenvalues in the open right half plane and $(y_{10}, \ldots, y_{n0}, y_{10})$ is the equilibrium state for the system. The first n state equations, which are linear in the duty ratios $d_i$, i=2, ..., n+1, are then solved to asymptotically stabilize the system about the equilibrium state as desired.

Combining eqs.30 and eq.33, the first n state equations are $$\beta_{11}d_2 + \beta_{12}d_3 + \ldots + \beta_{1n}d_{n+1} = \quad \text{(eqs. 34)}$$
$$-k_{11}(y_1 - y_{10}) - k_{12}(y_2 - y_{20}) - \ldots - k_{1n}(y_n - y_{n0}) - \alpha_1,$$

$$\beta_{n1}d_2 + \beta_{n2}d_3 + \ldots + \beta_{nn}d_{n+1} =$$
$$-k_{n1}(y_1 - y_{10}) - k_{n2}(y_2 - y_{20}) - \ldots - k_{nn}(y_n - y_{n0}) - \alpha_n.$$

The solution to eqs.34 is simply the column vector in the right hand side multiplied on the left by the inverse of the (n×n) $\beta = [\beta_{ij}]$ matrix, $\beta^{-1}$. The general solution is given by:

$$d = -\beta^{-1}[K(y - Y_0) - \alpha] \quad \text{(eq. 35)}$$

where $$\alpha = \begin{bmatrix} \alpha_1 \\ \vdots \\ \alpha_n \end{bmatrix}. \quad \text{(eq. 36)}$$

Coupling occurs since each duty ratio is a function of all output state variables $y_1, y_2, \ldots, y_n$.

For the case n=2, the solutions are $$d_2 = \frac{\beta_{22}(-k_{11}(y_1 - y_{10}) - k_{12}(y_2 - y_{20}) - \alpha_1) -}{\beta_{11}\beta_{22} - \beta_{12}\beta_{21}} \quad \text{(eqs. 37)}$$

$$d_3 = -\frac{\beta_{21}(-k_{11}(y_1 - y_{10}) - k_{12}(y_2 - y_{20}) - \alpha_1) -}{\beta_{11}\beta_{22} - \beta_{12}\beta_{21}}$$

with the denominator $(\beta_{11}\beta_{22} - \beta_{12}\beta_{21})$ evaluated as:

$$\frac{R_1 R_2 x_1}{(R_1 + R_{C_1})(R_2 + R_{C_2})}\begin{bmatrix} \frac{R_2 R_{C_1}(y_1 - u_0)}{LC_2(R_2 + R_{C_2})} + \\ \frac{R_1 R_{C_2}(y_2 - u_0)}{LC_1(R_1 + R_{C_1})} + \\ \frac{R_1 R_2 x_1}{C_1 C_2(R_1 + R_{C_1})(R_2 + R_{C_2})} \end{bmatrix} \quad \text{(eq. 38)}$$

Coupling occurs since each duty ratio is a function of both output state variables $y_1$ and $y_2$.

The generalized Ridley condition for the buck-boost converter and continuous conduction mode assumptions guarantee that this denominator is nonzero. The inverse matrix $\beta^{-1}$ for the n-stage buck-boost converter is derived in the appendix.

In preceding derivations, the gain matrix K associated to a proportional control system has been given. In alternative embodiments, the gain matrix K can be extended to include integral and derivative control.

Also, the exemplary embodiments are developed in the context of modern non-linear control theory, employing the generalized Ridley condition for the boost converter and the generalized Ridley condition for the buck-boost converter. If the Ridley condition cannot be met in practice for any reason, standard MIMO linear control methods can be applied to the boost and buck-boost converter control after reverting to Taylor series linearization about an operating state.

Simulations of MIMO Control

Following the MIMO control methods, a test of validity is accomplished by performing simulations of eqs.17. For the boost converter, nominal values are assigned to the parameters L, $C_1$, $C_2$, $R_1$ and $R_2$. The simulation is performed using Matlab, where the input voltage $u_0$=12 volts and $y_1$ approximated by $x_2$ and $y_2$ approximated by $x_3$ are the set of output voltages.

Figure 5A:
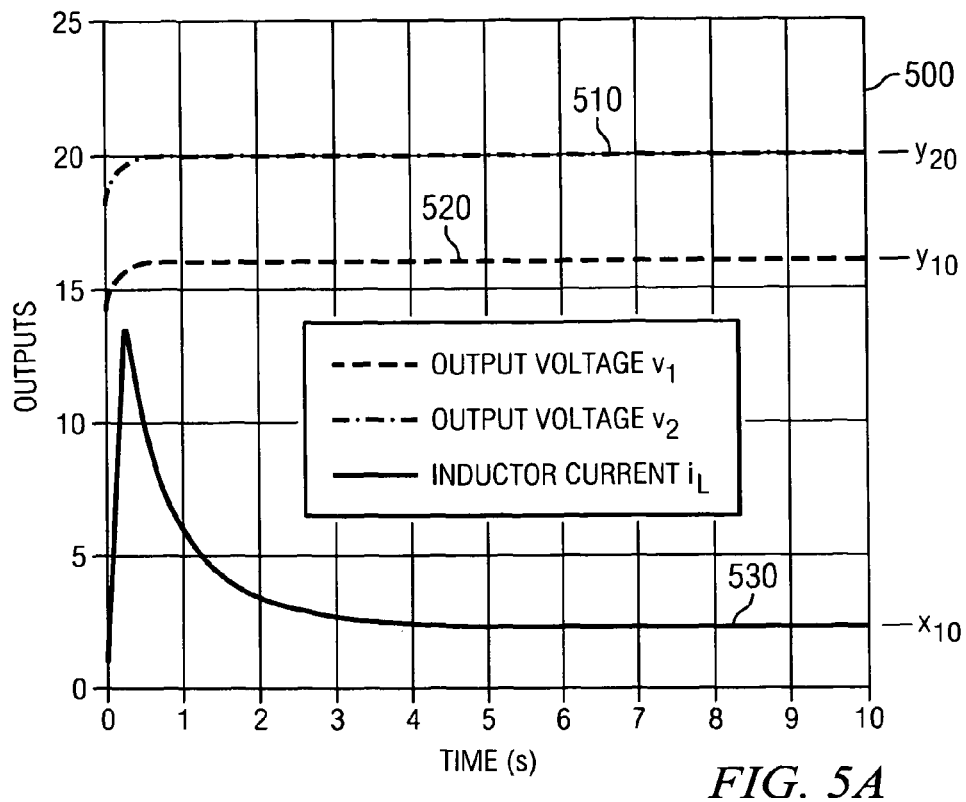
FIG. 5A is a simulation graph for the preferred multiple output boost converter having a predefined set of component values, a first output voltage of 16V, a second output voltage of 20V and simulating preferred MIMO control methods.

FIG. 5A shows simulation results for the boost converter which are plot 500 of output voltage vs. time including first curve 510 for the first output voltage $y_1$; second curve 520 for the second output voltage $y_2$; and, third curve 530 for $x_1$, the inductor current. The reference voltage $y_{10}$ is set to 16 volts and the reference voltage $y_{20}$ is set to 20 volts. According to the simulation result, the output voltages stabilize to the reference voltages well within 1 second from initial turn on.

Figure 5B:
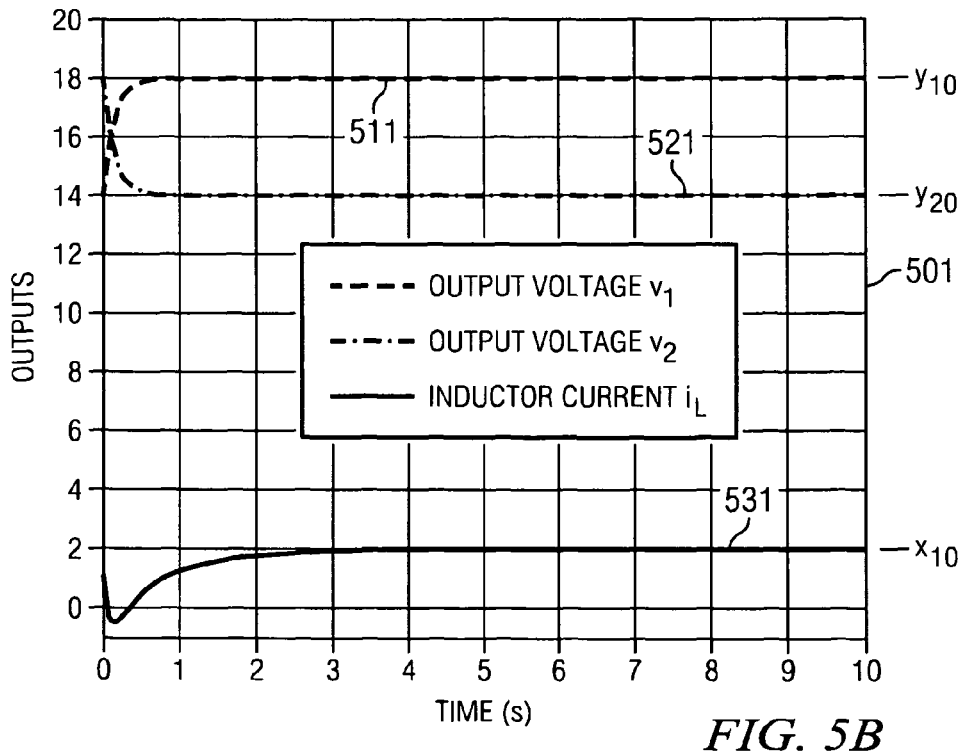
FIG. 5B is a simulation graph for the preferred multiple output boost converter having a predefined set of component values, a first output voltage of 18V, a second output voltage of 14V and simulating preferred MIMO control methods.

FIG. 5B shows simulation results for the boost converter which are plot 501 of output voltage vs. time including first curve 511 for the first output voltage $y_1$; second curve 521 for the second output voltage $y_2$; and, third curve 531 for $x_1$, the inductor current. The reference voltage $y_{10}$ is set to 18 volts and the reference voltage $y_{20}$ is set to 14 volts. According to the simulation result, the output voltages stabilize to the reference voltages well within 1 second from initial turn on.

Following the MIMO control methods another test of validity is accomplished by performing simulations of eqs.28. For the buck-boost converter, nominal values are assigned to the parameters $L$, $C_1$, $C_2$, $R_1$ and $R_2$. The simulation is performed using Matlab, where the input voltage $u_0=12$ volts and $y_1$ approximated by $x_2$ and $y_2$ approximated by $x_3$ are the set of output voltages.

Figure 6A:
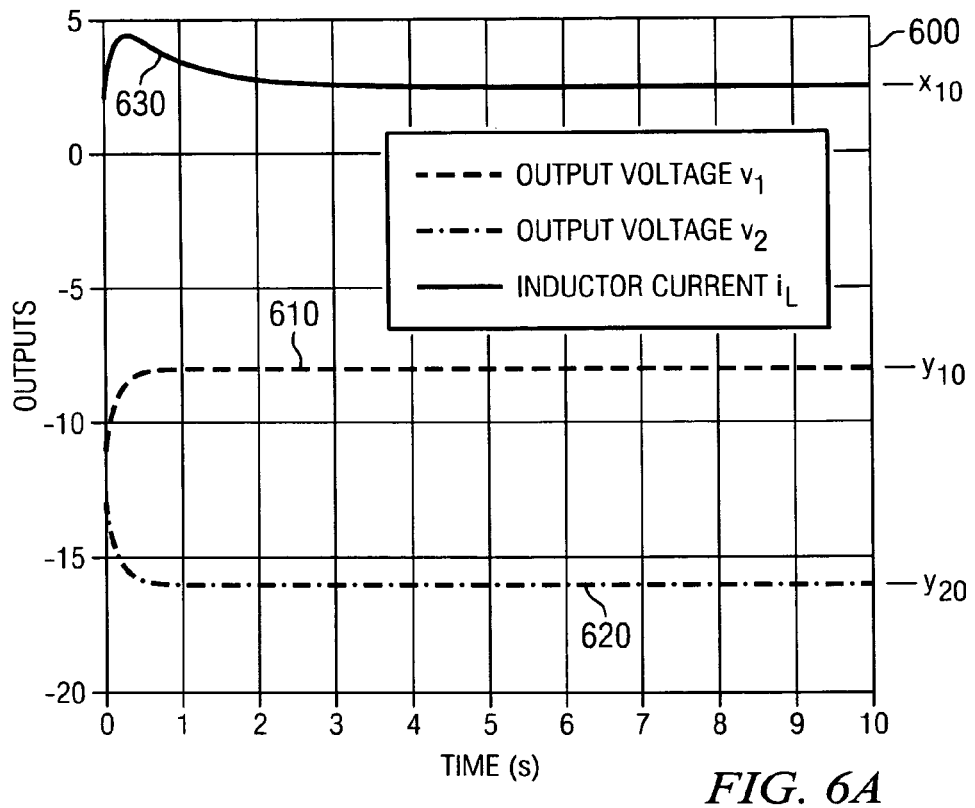
FIG. 6A is a simulation graph for the preferred multiple output buck-boost converter having a predefined set of component values, a first output voltage of −8V, a second output voltage of −16V and simulating preferred MIMO control methods.

FIG. 6A shows simulation results for the buck-boost converter which are plot 600 of output voltage vs. time including first curve 610 for the first output voltage $y_1$; second curve 620 for the second output voltage $y_2$; and, third curve 630 for $x_1$, the inductor current. The reference voltage $y_{10}$ is set to $-8$ volts and the reference voltage $y_{20}$ is set to $-16$ volts. According to the simulation result, the output voltages stabilize to the reference voltages well within 1 second from initial turn on.

Figure 6B:
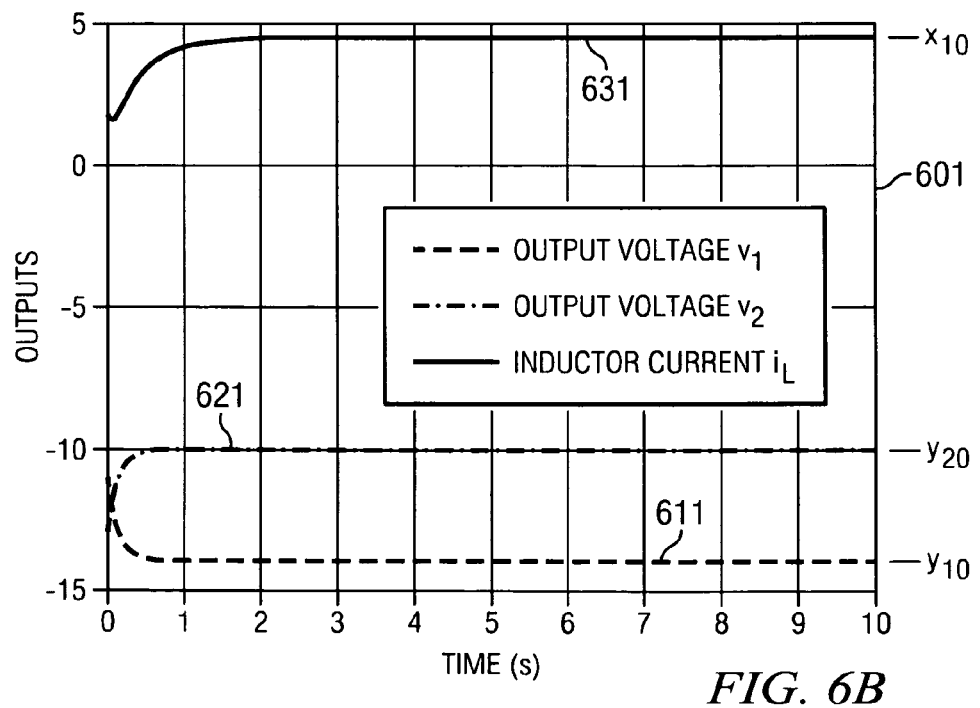
FIG. 6B is a simulation graph for the preferred multiple output buck-boost converter having a predefined set of component values, a first output voltage of −14V, a second output voltage of −10V and simulating preferred MIMO control methods.

FIG. 6B shows simulation results for the buck-boost converter which are plot 601 of output voltage vs. time including first curve 611 for the first output voltage $y_1$; second curve 621 for the second output voltage $y_2$; and, third curve 631 for $x_1$, the inductor current. The reference voltage $y_{10}$ is set to $-14$ volts and the reference voltage $y_{20}$ is set to $-10$ volts. According to the simulation result, the output voltages stabilize to the reference voltages well within 1 second from initial turn on.

Referring again to FIG. 7, the control method 700, and particularly step 710, is not intended to limit the invention, but is an exemplary embodiment of any of a number of different ways to implement a control method and a step for creating a control vector for the MIMO voltage converter system. In these exemplary embodiments, the control vector d is used to control a boost converter and a buck-boost converter. Note, that the present invention can be applied to many other or other converter types and to many other physical non-linear systems besides power converters.

In the foregoing examples, one input voltage $u_0$ is assumed. If multiple input voltages from multiple sources (e.g. grid, wind, solar, battery sources) are assumed, then the multiple input voltages can be converted to DC if necessary and summed to form a single summative input voltage $u_0$. Applying the MIMO control methods with single summative input $u_0$, the total system provides multiple desired output voltages in response to multiple input voltages.

APPENDIX

The inverse of the n×n matrix $\beta=[\beta_{ij}]$ for the multi-output boost converter is calculated as follows. Note that the inversion of the n×n matrix $\beta=[\beta_{ij}]$ involves a large number of cancellations. For example with n=3 we set $\beta_{11}=e_1y_1+f_1x_1$ $\beta_{12}=e_1y_2$ $\beta_{13}=e_1y_3$ $\beta_{21}=e_2y_1$ $\beta_{22}=e_2y_2+f_2x_1$ $\beta_{23}=e_2y_3$ $\beta_{31}=e_3y_1$ $\beta_{32}=e_3y_2$ $\beta_{33}=e_3y_3+f_3x_1$ (eqs.40)

The numerators of the entries of the inverse matrix in the same order are $\text{num}(\beta_{11}^{-1})=x_1[f_2f_3x_1+f_2e_3y_3+f_3e_2y_2]$ $\text{num}(\beta_{12}^{-1})=-f_3e_1x_1y_2$ $\text{num}(\beta_{13}^{-1})=-f_2e_1x_1y_3$ $\text{num}(\beta_{21}^{-1})=-f_3e_2x_1y_1$ $\text{num}(\beta_{22}^{-1})=x_1[f_1f_3x_1+f_1e_3y_3+f_3e_1y_1]$ $\text{num}(\beta_{23}^{-1})=-f_1e_2x_1y_3$ $\text{num}(\beta_{31}^{-1})=-f_2e_3x_1y_1$ $\text{num}(\beta_{32}^{-1})=-f_1e_3x_1y_2$ $\text{num}(\beta_{33}^{-1})=x_1[f_1f_2x_1+f_1e_2y_2+f_2e_1y_1]$ (eqs.41)

Where the common denominator is $\text{den}(\beta^{-1})=x_1^2[f_1f_2f_3x_1+f_1f_2e_3y_3+f_1f_3e_2y_2+f_2f_3e_1y_1]$ (eqs.42)

Once the highest power of $x_1$ is factored out of each numerator and the common denominator, the remaining terms are linear in $x_1$ and the various outputs indicated. This is true for a general n.

For the general case of n output voltages, set $\beta_{ii}=e_iy_i+f_ix_1$, $\beta_{ij}=e_iy_j$, for $i,j=1,\ldots,n, i\neq j$ (eqs.43)

The numerators of the entries of the inverse matrix starting with the first row and moving from left to right are:

$\text{num}(\beta_{11}^{-1})=$ (eqs. 44)

$x_1^{n-2}\begin{bmatrix} f_2f_3 \ldots f_nx_1+f_2f_3 \ldots f_{n-1}e_ny_n + \\ f_2f_3 \ldots f_{n-2}f_ne_{n-1}y_{n-1}+\ldots+f_3f_4 \ldots f_ne_2y_2 \end{bmatrix}$ $\text{num}(\beta_{12}^{-1})=-f_3f_4 \ldots f_ne_1x_1^{n-2}y_2$ $\vdots$ $\text{num}(\beta_{1n}^{-1})=-f_2f_3 \ldots f_{n-1}e_1x_1^{n-2}y_n$ $\text{num}(\beta_{21}^{-1})=-f_3f_4 \ldots f_ne_2x_1^{n-2}y_1$ $\text{num}(\beta_{22}^{-1})=$ $x_1^{n-2}\begin{bmatrix} f_1f_3 \ldots f_nx_1+f_1f_3 \ldots f_{n-1}e_ny_n+f_1f_3 \ldots \\ f_{n-2}f_ne_{n-1}y_{n-1}+\ldots+ \\ f_1f_4 \ldots f_ne_3y_3+f_3f_4 \ldots f_ne_1y_1 \end{bmatrix}$ $\text{num}(\beta_{23}^{-1})=-f_1f_4 \ldots f_ne_2x_1^{n-2}y_3$ $\vdots$ $\text{num}(\beta_{2n}^{-1})=-f_1f_3 \ldots f_{n-1}e_2x^{n-2}y_n$ $\vdots$ $\text{num}(\beta_{nn}^{-1})=$ $x_1^{n-2}\begin{bmatrix} f_1f_2 \ldots f_{n-1}x_1+f_1f_2 \ldots f_{n-2}e_{n-1}y_{n-1}+ \\ f_1f_2 \ldots f_{n-3}f_{n-1}e_{n-2}y_{n-2}+\ldots+ \\ f_2f_3 \ldots f_{n-1}e_1y_1 \end{bmatrix}$ with the common denominator:

$\text{den}(\beta^{-1})=x_1^{n-1}[f_1f_2\ldots f_nx_1+f_1f_2\ldots f_{n-1}e_ny_n+f_1f_2\ldots f_{n-2}e_n^{n-1}y_{n-1}+\ldots+f_2f_3\ldots f_ne_1y_1]$ (eqs. 45)

These entries in the inverse matrix appear ominous, but they are very simple since the products of the e's and the fs are numbers. After cancelling the common $x_1$ terms between the numerators and the common denominator, the denominator becomes $$den(\beta^{-1}) = \quad (\text{eqs. 46})$$

$$x_{10}\left[-\frac{(R_1+R_{C_1})}{R_1}R_{C_1}C_1y_{10} - \frac{(R_2+R_{C_2})}{R_2}R_{C_2}C_2y_{20} - \ldots - \frac{(R_n+R_{C_n})}{R_n}R_{C_n}C_ny_{n0} + Lx_{10}\right]$$

when evaluated at an equilibrium point.

Since $x_1$ is positive in continuous conduction mode, the requirement that this denominator be negative, the approximations of $$\frac{(R_i+R_{C_i})}{R_i} \quad (\text{eq. 47})$$

by 1, $i=1, \ldots, n$ and the approximations $$x_{10} = \frac{y_{(i-1)0}}{R_{i-1}D_i}, i=2,\ldots,n+1 \quad (\text{eqs. 48})$$

lead to the aforementioned generalized Ridley condition for the multi output boost converter.

The inverse of the n×n matrix $\beta=[\beta_{ij}]$ for the multi-output buck-boost converter proceeds similarly as for the multi-output boost converter. As for the boost converter, the inversion of the n×n matrix $\beta=[\beta_{ij}]$ involves a large number of cancellations.

The form of eqs.40, eqs. 41 and eq. 42 remain valid for the buck-boost converter although the e's and f's of the corresponding equations for the buck-boost converter evaluate differently than the boost converter.

For the general case of n output voltages, set $$\beta ii = e_i y_i + f_i x_1,$$

$$\beta ij = e_i y_j,$$

$$i,j=1,\ldots,n, i\neq j. \quad (\text{eqs. 49})$$

The numerators of the entries of the inverse matrix are:

$$num(\beta_{11}^{-1}) = x_1^{n-2}\begin{bmatrix} f_2f_3\ldots f_nx_1+f_2f_3\ldots f_{n-1}e_ny_n+f_2f_3\ldots \\ f_{n-2}f_ne_{n-1}y_{n-1}+\ldots+f_3f_4\ldots f_ne_2y_2 \end{bmatrix} \quad (\text{eqs. 50})$$

$$num(\beta_{12}^{-1}) = -f_3f_4\ldots f_ne_1x_1^{n-2}y_2$$

$$\vdots$$

$$num(\beta_{1n}^{-1}) = -f_2f_3\ldots f_{n-1}e_1x_1^{n-2}y_n$$

$$num(\beta_{21}^{-1}) = -f_3f_4\ldots f_ne_2x_1^{n-2}y_1$$

$$num(\beta_{22}^{-1}) =$$

$$x_1^{n-2}\begin{bmatrix} f_1f_3\ldots f_nx_1+f_1f_3\ldots f_{n-1}e_ny_n+f_1f_3\ldots \\ f_{n-2}f_ne_{n-1}y_{n-1}+\ldots+f_1f_4\ldots f_ne_3y_3+ \\ f_3f_4\ldots f_ne_1y_1 \end{bmatrix}$$

$$num(\beta_{23}^{-1}) = -f_1f_4\ldots f_ne_2x_1^{n-2}y_3$$

$$\vdots$$

$$num(\beta_{2n}^{-1}) = -f_1f_3\ldots f_{n-1}e_2x^{n-2}y_n$$

$$\vdots$$

$$num(\beta_{nn}^{-1}) =$$

$$x_1^{n-2}\begin{bmatrix} f_1f_2\ldots f_{n-1}x_1+f_1f_2\ldots f_{n-2}e_{n-1}y_{n-1}+f_1f_2\ldots \\ f_{n-3}f_{n-1}e_{n-2}y_{n-2}+\ldots+f_2f_3\ldots f_{n-1}e_1y_1 \end{bmatrix}$$

with the common denominator:

$$den(\beta^{-1}) = x_1^{n-1}[f_1f_2\ldots f_nx_1+f_1f_2\ldots f_{n-1}e_ny_n+f_1f_2\ldots f_{n-2}f_ne_{n-1}y_{n-1}+\ldots+f_2f_3\ldots f_ne_1y_1]. \quad (\text{eqs. 51})$$

After cancelling the common $x_1$ terms between the numerators and the common denominator the denominator becomes $$den(\beta^{-1}) = x_{10}\begin{bmatrix} \frac{(R_1+R_{C_1})}{R_1}R_{C_1}C_1(y_{10}-u_0) + \\ \frac{(R_2+R_{C_2})}{R_2}R_{C_2}C_2(y_{20}-u_0) + \ldots + \\ \frac{(R_n+R_{C_n})}{R_n}R_{C_n}C_n(y_{n0}-u_0) + Lx_{10} \end{bmatrix} \quad (\text{eq. 52})$$

when evaluated at an equilibrium point. Since $x_1$ is positive in continuous conduction mode, the requirement that this denominator be negative, the approximations of $$\frac{(R_i+R_{C_i})}{R_i} \quad (\text{eq. 53})$$

by 1, $i=1, \ldots, n$ and the approximations $$x_{10} = \frac{-y_{(i-1)0}}{R_{i-1}D_i}, i=2,\ldots,n+1 \quad (\text{eq. 54})$$

lead to the aforementioned generalized Ridley condition for the multi output buck-boost converter.

The invention claimed is:

1. A method for controlling a multiple output power converter, having a switched inductive circuit connected between a first polarity and a second polarity of a voltage source, and having a plurality of parallel capacitive circuits connected by a plurality of switches between a first node in the switched inductive circuit and the second polarity of the voltage source, the switched inductive circuit incorporating an inductor with inductance L having series resistance $R_s$, each capacitive circuit i of the plurality of parallel capacitive circuits incorporating a resistor $R_i$ in parallel with a capacitor $C_i$ having capacitive resistance $R_{Ci}$, the method using a PWM controller and comprising the steps of:

receiving into the PWM controller, a plurality of output voltages y, including at least one output voltage from each parallel capacitive circuit in the plurality of parallel capacitive circuits, a plurality of reference voltages $y_O$ from a reference voltage source, a first current $x_1$ through the inductor, and a supply voltage $u_0$ from the voltage source;

creating a plurality of difference voltages wherein each difference voltage represents the difference between an output voltage in y and a corresponding reference voltage in $y_O$;

conditioning the plurality of difference voltages in the PWM controller with a gain characterized by a gain matrix K;

creating a plurality of control signals having a plurality of duty ratios d, each control signal associated to a switch in the plurality of switches, where the plurality of duty ratios d are set according to:

$$d = -\beta^{-1}[K(y-y_0)-\alpha];$$

where d is a vector and the matrix $\beta$, its inverse matrix $\beta^{-1}$ and the vector $\alpha$ are determined by Cuk-Middlebrook state space averaging of the equations of state for y and $x_i$;

constraining the plurality of control signals with a modulation condition and a linearization condition based on y, $x_1$, $y_0$, and $u_0$;

controlling the multiple output power converter using the plurality of control signals.

2. The method as recited in claim 1, further comprising the step of constraining the plurality of control signals to provide leading-edge modulation with input-output linearization based on y, $x_1$, $y_0$, and $u_0$.

3. The method as recited in claim 1, further comprising the step of constraining the plurality of control signals to provide trailing-edge modulation with Taylor series linearization based on y, $x_1$, $y_0$, and $u_0$.

4. The method as recited in claim 1, further comprising the step of constraining the plurality of control signals to provide a leading-edge modulation with a Taylor series linearization based on y, $x_1$, $y_0$, and $u_0$.

5. The method as recited in claim 1, in which the step of constraining the plurality of control signals includes using a first order system.

6. The method as recited in claim 1, further comprising the step of conditioning the plurality of difference voltages in the PWM controller with a gain characterized by a gain matrix K having all eigenvalues in the open right half plane.

7. The method as recited in claim 1, further comprising the step of conditioning the plurality of difference voltages in the PWM controller with a gain characterized by a gain matrix K including proportional, integral and derivative gain terms.

8. The method as recited in claim 1, further comprising the step of constraining the values of L, $R_s$, $R_i$, $C_i$, and $R_{C_i}$ to obey a generalized Ridley condition.

9. The method of claim 8, further comprising the steps of:
constructing a boost converter as the multiple output power converter;
constraining the values of L, $R_s$, $R_i$, $C_i$, and $R_{C_i}$ for the boost converter with n capacitive circuits, according to:

$$R_{C_1}C_1R_1D_2 + R_{C_2}C_2R_2D_3 + \ldots + R_{C_n}C_nR_nD_{n+1} - L > 0;$$
and,
determining $D_i$ for i=2, ..., n+1 according to $$D_i = \frac{u_0 x_{i0}}{R_{i-1}} \left( \sum_{j=2}^{n+1} \frac{x_{j0}^2}{R_{j-1}} \right)^{-1}$$

where the $x_{i0}$ and $x_{j0}$ for i,j=1, 2, ..., n+1 define an equilibrium state for the boost converter.

10. The method of claim 8, further comprising the steps of:
constructing a buck-boost converter as the multiple output power converter;
constraining the values of L, $R_s$, $R_i$, $C_i$, and $R_{C_i}$ for the buck-boost converter according to:

$$(R_{C_1}C_1R_1D_2 + R_{C_2}C_2R_2D_3 + \ldots + R_{C_n}C_nR_nD_{n+1} - L)$$
$$x_{i0} > -(R_{C_1}C_1 + R_{C_2}C_2 + \ldots + R_{C_n}C_n)u_0; \text{ and,}$$

determining $D_i$ for i=2, ..., n+1 according to $$D_i = \frac{u_0 x_{i0}}{R_{i-1}} \left( \sum_{j=2}^{n+1} \frac{x_{j0}(u_0 + x_{j0})}{R_{j-1}} \right)^{-1}$$

where the $x_{i0}$ and $x_{j0}$, for i,j=1, 2, ..., n+1 define an equilibrium state for the buck-boost converter.

11. The method of claim 1, further comprising the steps of:
constructing a boost converter as the multiple output power converter;
determining the vector $\alpha$ according to:

$$\alpha_i = \frac{R_i}{R_i + R_{C_i}} \left[ R_{C_i} \frac{u_0}{L} + \left( -\frac{R_{C_i}R_s}{L} + \frac{R_{C_i}}{C_i(R_i + R_{C_i})} \right) x_1 \right] - \frac{1}{R_i + R_{C_i}} \frac{y_i}{C_i},$$

for i=1, 2, ..., n; and,
determining the matrix $\beta$ according to:

$$\beta_{ii} = \frac{R_i}{R_i + R_{C_i}} \left( -\frac{R_{C_i} y_i}{L} + \frac{R_i x_i}{C_i(R_i + R_{C_i})} \right),$$

$$\beta_{ij} = -\frac{R_i R_{C_i}}{R_i + R_{C_i}} \frac{y_j}{L},$$

for i,j=1, ..., n where i≠j.

12. The method of claim 1, further comprising the steps of:
constructing a buck-boost converter as the multiple output power converter;
determining the vector $\alpha$ according to:

$$\alpha_i = -\frac{R_i}{R_i + R_{C_i}} \left[ R_{C_i} \frac{u_0}{L} + \left( -\frac{R_{C_i}R_s}{L} + \frac{R_{C_i}}{C_i(R_i + R_{C_i})} \right) x_1 \right] - \frac{1}{R_i + R_{C_i}} \frac{y_i}{C_i},$$

for i=1, 2, ..., n; and,
determining the matrix $\beta$ according to:

$$\beta_{ii} = -\frac{R_i}{R_i + R_{C_i}} \left( \frac{R_{C_i}(y_i - u_0)}{L} + \frac{R_i x_i}{C_i(R_i + R_{C_i})} \right),$$

$$\beta_{ij} = -\frac{R_i R_{C_i}}{R_i + R_{C_i}} \frac{(y_j - u_0)}{L},$$

for i,j=1, ..., n where i≠j.

13. An apparatus comprising an electrical circuit that provide a plurality of control signals to a multiple output power converter, having a switched inductive circuit connected between a first polarity and a second polarity of a voltage source, and having a plurality of parallel capacitive circuits connected by a plurality of switches between a first node in the switched inductive circuit and the second polarity of the voltage source, the switched inductive circuit comprising an inductor with inductance L and series resistance $R_s$, each capacitive circuit i of the plurality of parallel capacitive circuits incorporating a resistor $R_i$ in parallel with a capacitor $C_i$ having capacitive resistance $R_{C_i}$, each control signal in the plurality of control signals associated to a switch in the plurality of switches and characterized by a plurality of duty ratios d defined as the vector $$d = -\beta^{-1}[K(y-y_0)-\alpha]$$

where y is a plurality of output voltages of the power converter, $y_0$ is a plurality of reference voltages associated with the plurality of output voltages, K is a gain matrix, the matrix β, its inverse matrix $β^{-1}$ and the vector α are determined by Cuk-Middlebrook state space averaging of the equations of state for y and for the inductor current $x_1$ through the inductor.

14. The apparatus as recited in claim 13, wherein the electrical circuit comprise:
   a PWM controller;
   a first set of connections to receive the plurality of output voltages y from the power converter to the PWM controller;
   a second set of connections to receive the plurality of reference voltages $y_0$ from a reference voltage source to the PWM controller;
   a third connection to receive a first signal representing the inductor current $x_1$ from the power converter to the PWM controller;
   a fourth connection to receive a source voltage $u_0$ from the voltage source to the PWM controller;
   a summing circuit in the PWM controller connected to the first set of connections and the second set of connections to create a plurality of difference voltages ($y-y_0$);
   a gain circuit in the PWM controller connected to the summing circuit to adjust the plurality of difference voltages to arrive at a plurality of conditioned voltages $K(y-y_0)$ according to the gain matrix K; and,
   a modulating circuit in the PWM controller connected to the gain circuit, the plurality of switches, the second set of connections, the third connection, and the fourth connection, the modulation circuit configured to create the plurality of control signals based on the plurality of duty ratios d, the set of output voltages, the first signal representing the inductor current $x_1$, the set of conditioned voltages, the matrix β, the vector α, and the source voltage $u_0$.

15. The apparatus of claim 14, in which the gain matrix K has all eigenvalues in the open right half plane.

16. The apparatus of claim 14, in which the gain matrix K includes proportional, integral and derivative gain terms.

17. The apparatus as recited in claim 14, wherein the set of electrical circuits further comprise a memory connected to the PWM controller in which a set of programmed instructions are stored and wherein the PWM controller is implemented according to one of the group consisting of a general purpose CPU, a digital signal processor, a microcontroller, a controller, a mixed signal SoC, an ASIC, an FPGA, a conventional electrical circuit and a combination thereof.

18. The apparatus of claim 17, wherein the set of programmed instructions, when executed by the PWM controller, perform the steps of:
   calculating the plurality of difference voltages ($y-y_0$);
   constructing the plurality of conditioned voltages $K(y-y_0)$;
   calculating the matrix β and the vector α based on the values of L, $R_s$, $R_i$, $C_i$, $R_{Ci}$, using Cuk-Middlebrook state space averaging of the equations of state for y and $x_1$, and providing for leading-edge modulation with input-output linearization;
   calculating the plurality of duty ratios d according to:

$$d = -β^{-1}[K(y-y_0)-α]$$

creating the plurality of control signals with the plurality of duty ratios d;
   controlling the multiple output power converter using the plurality of control signals.

19. The apparatus of claim 13, further comprising a multiple output boost converter with n parallel capacitive circuits in which the values of L, $R_s$, $R_i$, $C_i$, and $R_{Ci}$ satisfy:

$$R_{C_1} C_1 R_1 D_2 + R_{C_2} C_2 R_2 D_3 + \ldots + R_{C_n} C_n R_n D_{n+1} - L > 0; \text{ and,}$$

$$D_i = \frac{u_0 x_{i0}}{R_{i-1}} \left( \sum_{j=2}^{n+1} \frac{x_{j0}^2}{R_{j-1}} \right)^{-1} \text{ for } i=2, \ldots, n+1,$$

where the $x_{i0}$ and $x_{j0}$ for i,j=1, 2, . . . , n+1 define an equilibrium state for the boost converter.

20. The apparatus of claim 13, further comprising a multiple output buck-boost converter with n parallel capacitive circuits in which the values of L, $R_s$, $R_i$, $C_i$, and $R_{Ci}$ satisfy:

$$(R_{C_i} C_1 R_1 D_2 + R_{C_2} C_2 R_2 D_3 + \ldots + R_{C_n} C_n R_n D_{n+1} - L)x_{10} >$$
$$-(R_{C_1} C_1 + R_{C_2} C_2 + \ldots + R_{C_n} C_n)u_0; \text{ and,}$$

$$D_i = \frac{u_0 x_{i0}}{R_{i-1}} \left( \sum_{j=2}^{n+1} \frac{x_{j0}(u_0 + x_{j0})}{R_{j-1}} \right)^{-1} \text{ for } i=2, \ldots, n+1,$$

where the $x_{i0}$ and $x_{j0}$ for i,j=1, 2, . . . , n+1 define an equilibrium state for the buck-boost converter.

21. The apparatus of claim 13, further comprising:
   a multiple output boost converter;
   the vector α where:

$$α_i = \frac{R_i}{R_i + R_{C_i}} \left[ R_{C_i} \frac{u_0}{L} + \left( -\frac{R_{C_i} R_s}{L} + \frac{R_{C_i}}{C_i(R_i + R_{C_i})} \right) x_1 \right] - \frac{1}{R_i + R_{C_i}} \frac{y_i}{C_i},$$

for i=1, 2, . . . , n; and,
   the matrix β where:

$$β_{ii} = \frac{R_i}{R_i + R_{C_i}} \left( -\frac{R_{C_i} y_i}{L} + \frac{R_i x_i}{C_i(R_i + R_{C_i})} \right),$$

$$β_{ij} = -\frac{R_i R_{C_i}}{R_i + R_{C_i}} \frac{y_j}{L},$$

for i,j=1, . . . , n where i≠j.

22. The apparatus of claim 13, comprising:
   a multiple output buck-boost converter;
   the vector α where:

$$α_i = -\frac{R_i}{R_i + R_{C_i}} \left[ R_{C_i} \frac{u_0}{L} + \left( -\frac{R_{C_i} R_s}{L} + \frac{R_{C_i}}{C_i(R_i + R_{C_i})} \right) x_1 \right] - \frac{1}{R_i + R_{C_i}} \frac{y_i}{C_i},$$

for i=1, 2, . . . , n; and,
   the matrix β where:

$$β_{ii} = -\frac{R_i}{R_i + R_{C_i}} \left( \frac{R_{C_i}(y_i - u_0)}{L} + \frac{R_i x_1}{C_i(R_i + R_{C_i})} \right),$$

$$β_{ij} = -\frac{R_i R_{C_i}}{R_i} \frac{(y_j - u_0)}{L},$$

for i,j=1, n where i≠j.

23. A power converter system comprising:
a multiple output boost converter, further comprising an inductor connected to a first polarity of a source voltage $u_0$, the inductor further connected to a switch S at a first node, the switch S connected to a second polarity of the voltage source $u_0$ at a second node, the inductor having inductance L with parasitic resistance $R_S$, a plurality of parallel capacitive circuits connected by a plurality of switches between the first node and the second node, each parallel capacitive circuit i in the plurality of parallel capacitive circuits including a capacitor of capacitance $C_i$ and capacitive resistance $R_{Ci}$ and a load resistor of resistance $R_i$ connected in parallel across the capacitor of capacitance $C_i$;
the multiple output boost converter having a plurality of output voltages y taken from the plurality of parallel capacitive circuits;
an inductor current $x_1$ through the inductor;
a reference voltage source having a plurality of reference voltages $y_0$; and
a PWM controller comprising:
  a summing circuit connected to the plurality of output voltages y and the plurality of reference voltages $y_0$ configured to create a plurality of difference voltages $(y-y_0)$;
  a gain circuit connected to the summing circuit to adjust the plurality of difference voltages to arrive at a plurality of conditioned voltages $K(y-y_0)$ according to a gain matrix K; and,
  a modulating circuit connected to the gain circuit and the plurality of switches, and configured to sense the source voltage $u_0$, the plurality of output voltages y, the inductor current $x_1$ and the plurality of reference voltages $y_0$ to create a plurality of control signals to control the multiple output boost converter, wherein the plurality of control signals provides leading-edge modulation of the plurality of switches with input-output linearization that is based on $u_0$, y, $y_0$, $x_1$, and $K(y-y_0)$, where the plurality of control signals have a plurality of duty ratios d defined by the vector:

$$d = -\beta^{-1}[K(y-y_0) - \alpha];$$

where the matrix $\beta$, its inverse matrix $\beta^{-1}$ and the vector $\alpha$ are determined by Cuk-Middlebrook state space averaging of the equations of state for y and $x_1$.

24. The apparatus of claim 23, in which the gain matrix K has all eigenvalues in the open right half plane.

25. The apparatus of claim 23, in which the gain matrix K includes proportional, integral and derivative gain terms.

26. The apparatus of claim 23, further comprising a memory connected to the PWM controller in which a set of programmed instructions are stored and wherein the PWM controller is implemented according to one of the group consisting of a general purpose CPU, a digital signal processor, a microcontroller, a controller, a mixed signal SoC, an ASIC, an FPGA, a conventional electrical circuit and a combination thereof.

27. The apparatus of claim 26, wherein the set of programmed instructions, when executed by the PWM controller, perform the steps of:
calculating the plurality difference voltages $(y-y_0)$;
constructing the plurality of conditioned voltages $K(y-y_0)$;
calculating the matrix $\beta$ and the vector $\alpha$ based on the values of L, $R_s$, $R_i$, $C_i$, $R_{Ci}$, using Cuk-Middlebrook state space averaging of the equations of state for y and $x_1$, and providing for leading-edge modulation with input-output linearization;
calculating the plurality of duty ratios d according to:

$$d = -\beta^{-1}[K(y-y_0) - \alpha]$$

creating the plurality of control signals with the plurality of duty ratios d;
controlling the multiple output boost converter using the plurality of control signals.

28. The apparatus of claim 23, further comprising n parallel capacitive circuits in which the values of L, $R_s$, $R_i$, $C_i$, and $R_{Ci}$ satisfy:

$$R_{C_1}C_1R_1D_2 + R_{C_2}C_2R_2D_3 + \ldots + R_{C_n}C_nR_nD_{n+1} - L > 0; \text{ and,}$$

$$D_i = \frac{u_0 x_{i0}}{R_{i-1}}\left(\sum_{j=2}^{n+1} \frac{x_{j0}^2}{R_{j-1}}\right)^{-1} \text{ for } i = 2, \ldots, n+1,$$

where the $x_{i0}$ and $x_{j0}$ for i,j=1, 2, . . . , n+1 define an equilibrium state for the multiple output boost converter.

29. The apparatus of claim 23 comprising:
the vector $\alpha$ where:

$$\alpha_i = \frac{R_i}{R_i + R_{C_i}}\left[R_{C_i}\frac{u_0}{L} + \left(-\frac{R_{C_i}R_s}{L} + \frac{R_{C_i}}{C_i(R_i + R_{C_i})}\right)x_1\right] - \frac{1}{R_1 + R_C}\frac{y_i}{C_i},$$

for i=1, 2, . . . , n; and,
the matrix $\beta$ where:

$$\beta_{ii} = \frac{R_i}{R_i + R_{C_i}}\left(-\frac{R_{C_i}y_i}{L} + \frac{R_i x_1}{C_i(R_i + R_{C_i})}\right),$$

$$\beta_{ij} = -\frac{R_i R_{C_i}}{R_i + R_{C_i}}\frac{y_j}{L},$$

for i,j=1, . . . , n where i≠j.

30. A power converter system comprising:
a multiple output buck-boost converter, further comprising a switch S connected to a first polarity of a source voltage $u_0$, the switch S further connected to an inductor at a first node, the inductor connected to a second polarity of the voltage source $u_0$ at a second node, the inductor having inductance L with parasitic resistance $R_S$, a plurality of parallel capacitive circuits connected in series with a plurality of switches between the first node and the second node, each parallel capacitive circuit i in the plurality of parallel capacitive circuits including a capacitor of capacitance $C_i$ and capacitive resistance $R_{Ci}$ and a load resistor of resistance $R_i$ connected in parallel across the capacitor of capacitance $C_i$;
the multiple output buck-boost converter having a plurality of output voltages y taken from the plurality of parallel capacitive circuits;
an inductor current $x_1$ through the inductor;
a reference voltage source having a plurality of reference voltages $y_0$; and
a PWM modulator/controller comprising:
  a summing circuit connected to the plurality of output voltages y and the plurality of reference voltages $y_0$ configured to create a plurality of difference voltages $(y-y_0)$;

a gain circuit connected to the summing circuit to adjust the plurality of difference voltages to arrive at a plurality of conditioned voltages $K(y-y_0)$ according to a gain matrix K; and, a modulating circuit connected to the gain circuit and the plurality of switches, and configured to sense the source voltage $u_0$, the plurality of output voltages y, the inductor current $x_1$ and the plurality of reference voltages $y_0$ to create a plurality of control signals to control the multiple output buck-boost converter, wherein the plurality of control signals provides leading-edge modulation of the plurality of switches with input-output linearization that is based on $u_0$, y, $y_0$, $x_1$, and $K(y-y_0)$, where the plurality of control signals have a plurality of duty ratios d defined by the vector:

$$d = -\beta^{-1}[K(y-y_0)-\alpha];$$

where the matrix $\beta$, its inverse matrix $\beta^{-1}$ and the vector $\alpha$ are determined by Cuk-Middlebrook state space averaging of the equations of state for y and $x_1$.

31. The apparatus of claim 30, in which the gain matrix K has all eigenvalues in the open right half plane.

32. The apparatus of claim 30, in which the gain matrix K includes proportional, integral and derivative gain terms.

33. The apparatus of claim 30, further comprising a memory connected to the PWM controller in which a set of programmed instructions are stored and wherein the PWM controller is implemented according to one of the group consisting of a general purpose CPU, a digital signal processor, a microcontroller, a controller, a mixed signal SoC, an ASIC, an FPGA, a conventional electrical circuit and a combination thereof.

34. The apparatus of claim 33, wherein the set of programmed instructions, when executed by the PWM controller, perform the steps of:

calculating the plurality of difference voltages $(y-y_0)$;

constructing the plurality of conditioned voltages $K(y-y_0)$;

calculating the matrix $\beta$ and the vector $\alpha$ based on the values of L, $R_s$, $C_i$, $R_{Ci}$, using Cuk-Middlebrook state space averaging of the equations of state for y and $x_1$, and providing for leading-edge modulation with input-output linearization;

calculating the plurality of duty ratios d according to:

$$d = -\beta^{-1}[K(y-y_0)-\alpha]$$

creating the plurality of control signals with the plurality of duty ratios d;

controlling the multiple output buck-boost converter using the plurality of control signals.

35. The apparatus of claim 30 comprising n parallel capacitive circuits in which the values of L, $R_s$, $R_i$, $C_i$, and $R_{Ci}$ satisfy:

$$(R_{C_1}C_1R_1D_2 + R_{C_2}C_2R_2D_3 + \ldots + R_{C_n}C_nR_nD_{n+1} - L)x_{10} >$$
$$-(R_{C_1}C_1 + R_{C_2}C_2 + \ldots + R_{C_n}C_n)u_0; \text{ and,}$$

$$D_i = \frac{u_0 x_{i0}}{R_{i-1}} \left( \sum_{j=2}^{n+1} \frac{x_{j0}(u_0 + x_{j0})}{R_{j-1}} \right)^{-1} \text{ for } i = 2, \ldots, n+1,$$

where the $x_{i0}$ and $x_{j0}$ for i,j=1, 2, . . . , n+1 define the equilibrium state for the buck-boost converter.

36. The apparatus of claim 30 comprising:
the vector $\alpha$ where:

$$\alpha_i = -\frac{R_i}{R_i + R_{C_i}} \left[ R_{C_i} \frac{u_0}{L} + \left( -\frac{R_{C_i}R_s}{L} + \frac{R_{C_i}}{C_i(R_i + R_{C_i})} \right) x_1 \right] - \frac{1}{R_i + R_{C_i}} \frac{y_i}{C_i},$$

for i=1, 2, . . . , n; and,
the matrix $\beta$ where:

$$\beta_{ii} = -\frac{R_i}{R_i + R_{C_i}} \left( \frac{R_{C_i}(y_i - u_0)}{L} + \frac{R_i x_1}{C_i(R_i + R_{C_i})} \right),$$

$$\beta_{ij} = -\frac{R_i R_{C_i}}{R_i + R_{C_i}} \frac{(y_j - u_0)}{L},$$

for i,j=1, n where i≠j.

37. The apparatus of claim 30 comprising two parallel capacitive circuits.

* * * * *